(12) United States Patent
Yamada et al.

(10) Patent No.: US 7,354,299 B2
(45) Date of Patent: Apr. 8, 2008

(54) ELECTRICAL CONNECTOR

(75) Inventors: Akio Yamada, Koto-ku (JP); Kato Hiromichi, Koto-ku (JP)

(73) Assignee: DDK Ltd (JP)

( * ) Notice: Subject to any disclaimer, the term of this patent is extended or adjusted under 35 U.S.C. 154(b) by 0 days.

(21) Appl. No.: 10/536,773

(22) PCT Filed: Dec. 8, 2004

(86) PCT No.: PCT/JP2004/018688

§ 371 (c)(1),
(2), (4) Date: Jul. 17, 2006

(87) PCT Pub. No.: WO2005/067102

PCT Pub. Date: Jul. 21, 2005

(65) Prior Publication Data

US 2006/0252310 A1    Nov. 9, 2006

(30) Foreign Application Priority Data

Jan. 7, 2004    (JP) .............................. 2004-001524

(51) Int. Cl.
*H01R 9/05* (2006.01)
(52) U.S. Cl. ................. 439/497; 439/579; 439/680
(58) Field of Classification Search .............. 439/497, 439/579, 680, 610
See application file for complete search history.

(56) References Cited

U.S. PATENT DOCUMENTS

| | | | | |
|---|---|---|---|---|
| 4,655,515 A | * | 4/1987 | Hamsher et al. | 439/108 |
| 5,241,135 A | * | 8/1993 | Fetzer | 174/88 R |
| 5,815,916 A | | 10/1998 | Luc | |
| 6,380,485 B1 | * | 4/2002 | Beaman et al. | 174/88 R |
| 6,475,024 B1 | * | 11/2002 | Narui | 439/495 |
| 6,840,792 B1 | * | 1/2005 | Kuan | 439/404 |
| 6,869,308 B2 | * | 3/2005 | Wu | 439/497 |
| 6,913,485 B2 | * | 7/2005 | Ko | 439/579 |
| 6,932,648 B1 | * | 8/2005 | Chiu et al. | 439/607 |
| 7,001,213 B2 | * | 2/2006 | Kaneko et al. | 439/579 |
| 2005/0075009 A1 | * | 4/2005 | Ko | 439/579 |
| 2006/0019529 A1 | * | 1/2006 | Ko | 439/497 |

FOREIGN PATENT DOCUMENTS

| | | |
|---|---|---|
| EP | 951092 A2 | 10/1999 |
| FR | 2742007 A1 | 6/1997 |

(Continued)

*Primary Examiner*—Gary F. Pauman
(74) *Attorney, Agent, or Firm*—Baker Botts L.L.P.

(57) ABSTRACT

An electrical connector includes a plug connector and a receptacle connector detachably fitted with each other. The plug connector comprises a plurality of coaxial cables, a flexible printed circuit board and a ground bar. Each of the coaxial cable has a center conductor, an insulator covering the center conductor, a braid as an external conductor covering the insulator, and a sheath covering the braid. The flexible printed circuit board has lands each connected to the center conductor of the coaxial cable and land portions to which the ground bar is connected. The grand bar has a main portion adapted to contact the braids of the coaxial cables, and fixed portions each positioned contiguously with the main portion and connected to the land portion. The electrical connector achieves the low height geometry of the plug connector and hence that of the receptacle connector and precludes any failed connection between the ground bar and the coaxial cables.

27 Claims, 14 Drawing Sheets

FOREIGN PATENT DOCUMENTS

| | | |
|---|---|---|
| JP | 9-180787 A | 7/1997 |
| JP | 11-307187 A | 11/1999 |
| JP | 2000-195619 A | 7/2000 |
| JP | 2001-15187 A | 1/2001 |
| JP | 2002-8789 A | 1/2002 |

* cited by examiner

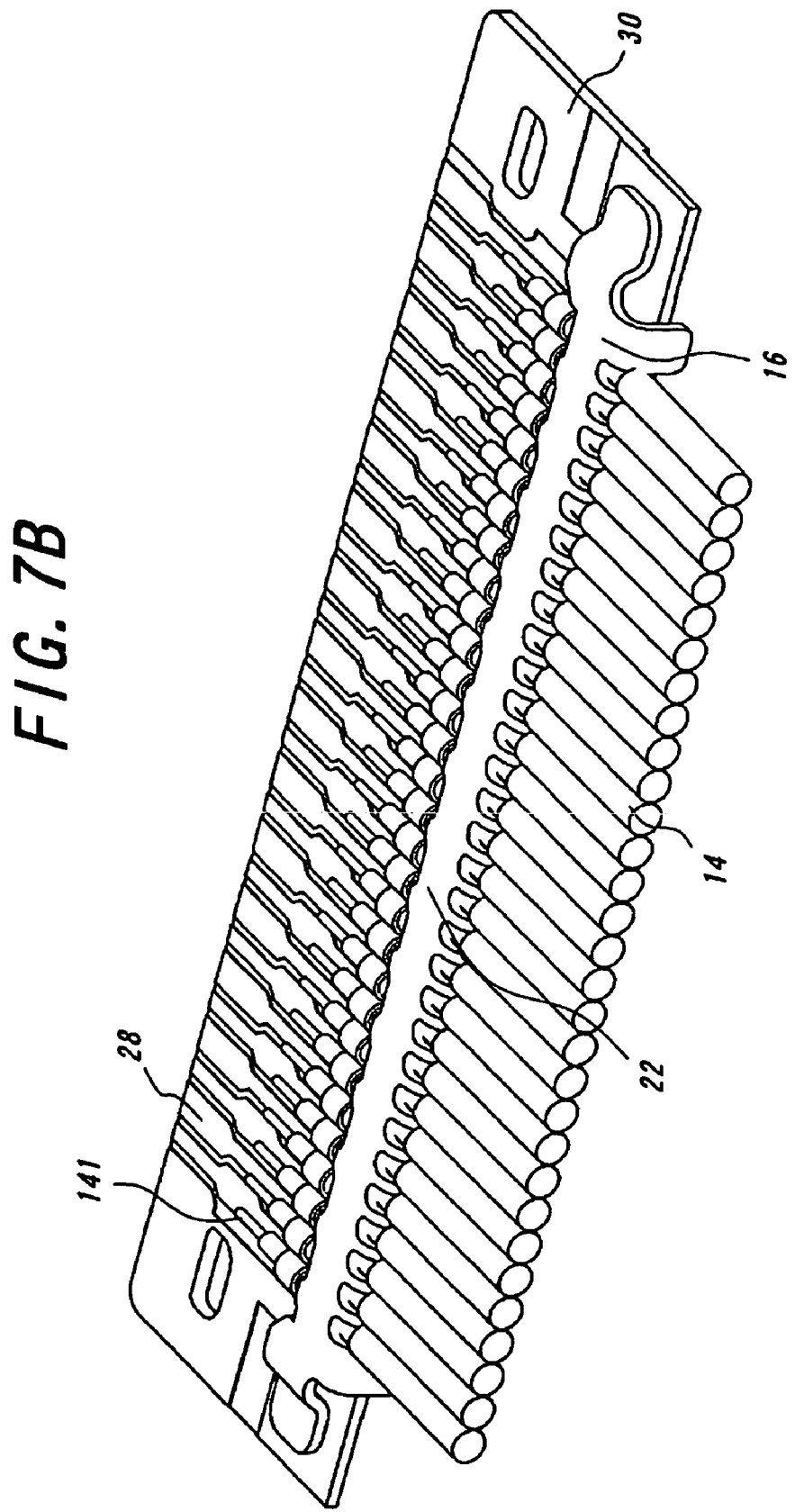

ELECTRICAL CONNECTOR

CROSS-REFERENCE TO RELATED APPLICATIONS

This application is a national phase of International Application No. PCT/JP04/018688, filed Dec. 8, 2004, which claims priority from Japanese Patent Application No. 2004-1,524, filed Jan. 7, 2004, each of which are incorporated by reference in their entireties herein, and from which priority is claimed.

TECHNICAL FIELD

This invention relates to a plug connector for use with appliances such as a mobile phone or cellular telephone, notebook personal computer, digital camera and the like, and more particularly to a construction for achieving the flat geometry of a plug connector.

There is no particularly relevant patent literature disclosed within scope of our research. In order to reduce the noise in appliances, coaxial cables 14 have frequently been used because of their shielding effects. For example, as shown in FIGS. 8 and 9, for the purpose of connecting the coaxial cables 14 to a hard substrate, a plug connector 60 and a receptacle connector 80 have been used. Namely, the coaxial cables 14 are connected to the plug connector 60, while the hard substrate is connected to the receptacle connector 80. The plug connector 60 and the receptacle connector 80 are then fitted with each other so that the coaxial cables 14 are brought into connection with the hard substrate, thereby accomplish the continuity therebetween.

An example of electrical connectors of prior art will be explained with reference to FIGS. 8 and 9. The electrical connector 5 comprises a plug connector 60 and a receptacle connector 80 detachably fitted with each other. FIG. 8 illustrates in a perspective view the plug and receptacle connectors 60 and 80 prior to being fitted with each other. FIG. 9 shows in a perspective view the plug connector 60 with the plug shell removed.

The plug connector 60 mainly comprises a block 62, plug contacts 64, a ground bar 66, and a plug shell 68. The receptacle connector 80 mainly comprises a housing 82, contacts, and a receptacle shell 88.

First, the block 62 of the plug connector 60 includes an inserting hole 70 into which coaxial cables 14 are inserted as shown in FIG. 8. After the coaxial cables 14 are inserted into the inserting hole 70, center conductors 141 of the coaxial cables 14 are each connected to the plug contact 64, and the braids 143 of the coaxial cables 14 are connected to the ground bar 66 as by soldering or insulation displacement. Thereafter, the plug shell 68 thus combined with the other members is fitted on the block 62. The block 62 is provided with a plurality of protrusions 76 like teeth of a comb for arranging the coaxial cables 14 as shown in FIG. 9. The center conductors 141 of the coaxial cables 14 are each connected to the connection portion of the plug contact 64 in one of loading portions 74 in the block 62. The plug shell 68 is provided with a plurality of anchoring pieces 78 and a plurality of contact pieces 79. The anchoring pieces 78 contact the grand bar 66 to cause the continuity of the coaxial cables 14 and the plug shell 68, thereby providing grounding. Consequently, when the plug connector 60 and the receptacle connector 80 are fitted with each other, the contact pieces 79 of the plug shell 68 contact the receptacle shell 88 which has been fixed to a hard substrate to cause the continuity of the coaxial cables 14 and the hard substrate, thereby achieving the overall grounding. On the opposite side of the inserting hole 70, moreover, there is provided a fitting portion 72 for fitting with or connecting to the receptacle connector 80. At the fitting portion 72, the plug contacts 64 are arranged and held so that these plug contacts 64 are brought into contact with the contacts 82 of the receptacle connector 80 when the plug and receptacle connectors are fitted with each other. The plug contacts 64 each mainly comprise a contact portion 641 adapted to contact the receptacle connector 80, a fixed portion held by the block 62, and a connection portion 643 to be connected to the coaxial cable 14.

On the other hand, the receptacle connector 80 includes a fitting opening 52 into which the plug connector 60 is inserted as shown in FIG. 8. Contact portions of the contacts are arranged and held in the fitting opening 52 so as to extend into the fitting opening so that the continuity of the plug and receptacle connectors 60 and 80 can be achieved by inserting the fitting portion 72 of the plug connector 60 into the fitting opening 52. The contacts each mainly comprise a contact portion adapted to contact the contact portion of the plug contact 64, a fixed portion held by the housing 82, and a connection portion to be connected to a hard substrate. The receptacle shell 88 is installed in the housing 82 by press-fitting, lancing or hooking. The receptacle shell 88 is provided with fixing tabs 54 which are soldered to the hard substrate as by reflow soldering together with the connection portions of the contacts.

In recent years, with miniaturization of electronic or electrical appliances such as a mobile phone, the requirement for more miniaturization, particularly flat geometry or vertical size for reducing the thickness has put more severe pressure on receptacle connectors to be mounted with the above-mentioned appliances and plug connectors to be fitted with the receptacle connectors.

With the construction of the plug connector described above, however, the thicknesses of the plug contacts and the thickness of the block required for holding the plug contacts have minimum limitations which make it impossible to realize a flat geometry less than 1.4 mm of the plug connector as a problem to be solved.

On the other hand, even with the construction of the receptacle connector described above, it requires to some extent to have thicknesses of side walls of the housing at the both ends, the contact portions of the contacts arranged on both the sides, and fitting portion of the plug connector to be inserted in the fitting opening, and particularly the thickness of the fitting portion of the plug connector is approximately one third of the overall thickness. Therefore, the flat geometry of the plug connector is unavoidable in order to achieve the flat geometry of the receptacle connector.

With the construction of the plug connector, moreover, in the case that coaxial cables having a fine diameter are used with a narrow pitch, when the braids of the coaxial cables are connected to the ground bar by soldering, the insulators of the coaxial cables tend to melt by the heat of the soldering to cause the continuity of the braids and the center conductors, resulting into failed connection.

With the construction of the plug connector described above, as the coaxial cables are connected to a rigid body not having a flexibility, the connection portions of the coaxial cables tend to be partly broken depending on the used condition such as being bent, resulting into defective connection. Moreover, requirements for more shielding have progressively increased with the use of high-speed transmission of electronic appliances.

Furthermore, there is a requirement to prevent an erroneous fitting to insert the plug connector upside down into the receptacle connector in view of problems of misconnection and to prevent a problem of destruction of the plug connector or the receptacle connector.

SUMMARY OF THE INVENTION

It is an object of the invention to provide an improved electrical connector which eliminate all the disadvantages of the prior art, and which achieves the flat geometry of its plug connector 60 and hence of its receptacle connector 80 to the desired extent and can preclude any defective connection between a ground bar 66 and coaxial cables 14.

The object described above can be achieved by an electrical connector 1 including a plug connector 10 and a receptacle connector 40 detachably fitted with each other, wherein according to the invention the plug connector 10 comprises a plurality of coaxial cables 14 each having a center conductor 141, an insulator 142 covering the center conductor 141, a braid 143 as an external conductor covering the insulator 142, and a sheath 144 covering the braid 143; a flexible printed circuit board 12 having lands 28 each connected to the center conductor 141 of the coaxial cable 14 and land portions 30 to which a ground bar 16 is connected; and the ground bar 16 having a main portion 22 adapted to contact the braids 143 and fixed portions 24 each positioned contiguously with the main portion 22 and connected to the land portion 30.

In a preferred embodiment of the invention, the receptacle connector 40 comprises a housing 42, contacts 44, locking lever 46, and a receptacle shell 48 covering the housing 42 except for its portion associated with the locking lever 46, and the receptacle shell 48 is provided on the side of a fitting opening 52 with at least one contacting means adapted to contact the upper surface of the ground bar 16 of the plug connector 10. In this manner, the receptacle shell 48 and the ground bar 16 are securely brought into contact with each other, thereby more easily and more certainly achieving the continuity between the coaxial cables 14 and a hard substrate and providing grounding.

Preferably, the ground bar 16 of the plug connector 10 is provided with projection pieces 26 which extend from the main portion 22 of the ground bar 16 and is adapted to contact the braids 143 at locations between the center conductors of all the coaxial cables or at locations between the center conductors of every other coaxial cable 14. Moreover, the ground bar 16 of the plug connector 10 is provided with projection pieces 26 which extend from the main portion 22 of the ground bar and is adapted to contact the braids 143 at intervals of plural locations between the coaxial cables 14. The projection pieces 26 are brought into contact with the braids 143 of the coaxial cables 14 in this manner to eliminate soldering therebetween, thereby precluding any defective connection caused by melting of the insulator 142 by heat in soldering.

In a preferred embodiment, the projection pieces 26 are in the form of a substantially L-shape. By forming the projection pieces in the form of the substantially L-shape, the ground bar 16 is only put on the coaxial cables to cause the projection pieces 26 in the form of comb teeth to insert into between the braids 143 of the coaxial cables 14. In the case that the pitch of the coaxial cables 14 is narrow such as 0.3 mm, the projection pieces 26 may be a substantially L-shape whose leading end may be of a substantially sharp triangle so that the triangular portions are simply caused to contact between the braids 143 of the coaxial cables without insertion of the triangular portions, thereby achieving the above effect.

Preferably, the projection pieces 26 in the form of the substantially L-shape located at intervals of plural locations extend beyond the braids 143 and fixed to the flexible printed circuit board 12 by soldering. In this manner, the ground bar 16 is prevented from rising away from the coaxial cables.

The contacts 44 at both the ends of the receptacle connector 40 are preferably each connected to the land portion 30. With this construction, the continuity between the coaxial cables 14 and the hard substrate can be readily achieved, thereby providing the grounding.

One preferred embodiment according to the invention, each of the contacts 44 of the receptacle connector 40 comprises a contact portion 441, a connection portion 443, an elastic portion 445 and a fulcrum portion 444 provided between the contact portion 441 and the connection portion 443, a pressure receiving portion 446 positioned opposed to the connection portion 443 and extending from the elastic portion 445, and an extension portion having a further contact portion 441 on the opposite side of the first mentioned contact portion 441, and the first mentioned contact portion 441, the elastic portion 445, the fulcrum portion 444 and the connection portion 443 are arranged in the form of a crank, and further the locking lever 46 of the receptacle connector 40 is provided with urging portions 461 successively in its longitudinal direction, and the locking lever 46 is installed in the housing 42 so that the urging portions 461 are each pivotally movable in the space between the connection portion 443 and the pressure receiving portion 446 of the contact 44. By using the receptacle connector 40 having such a construction, the electrical connector will become of "ZIP (zero-insertion force)" type so that the plug connector 10 can be easily fitted in the receptacle connector 40, resulting in enhancing of the flat geometry of the receptacle connector 40.

More preferably, the receptacle connector 40 is provided with locking members 50 in the same construction as that of the contacts 44, and the flexible printed circuit board 12 is provided with anchoring portions 32 each at position corresponding to engaging portion 501 of the locking member 50. By providing the locking members 50 in this manner, a stable holding force can be obtained when the plug and receptacle connectors 10, 40 are fitted with each other.

In one preferable embodiment of the invention, as the contact means of the receptacle shell 48 there is provided a protrusion 56 extending into the fitting opening 52 or an elastic piece 57 having an elasticity extending into the fitting opening 52. By providing such contact means, the receptacle shell 48 and the ground bar 16 can be more securely caused to contact with each other, and the continuity therebetween can be easily achieved.

Explaining the function of the receptacle connector 40 further, the plug connector 10 is inserted with its flexible printed circuit board and the coaxial cables into the fitting opening 52 of the housing 42 of the receptacle connector 40, and then the locking lever 46 is pivotally moved in the direction shown by an arrow A in FIG. 2. As a result, the pressure receiving portions 446 of the contacts 44 are raised with the aid of the variation in contact height owing to, for example, the elliptical shape of the urging portions 461 so that the elastic portions 445 of the contacts 44 are tilted about their fulcrum portions 444 toward the contact portions 441 to urge the contact portions 441 toward the flexible printed circuit board 12, thereby bringing the contact portions 441 into contact with the flexible printed circuit board 12.

The ground bar 16 is provided with protrusion pieces 27 contiguously with the main portion 22 at predetermined positions on the surface of the main portion 22 of the ground bar 16. The protrusion pieces 27 are caused to pierce into the coaxial cables 14 so that the ground bar 16 is brought into contact with the center conductors 141 and the braids 143 of the coaxial cables 14, thereby obtaining the grounding between the coaxial cables 14 to achieve the shielding effect.

The protrusion pieces 27 of the grand bar 16 are arranged so that the protrusion pieces 27 will pierce into every other or every third coaxial cable. In this manner, the grounding can be obtained between the every other coaxial cable 14 or every third coaxial cable 14 to achieve the shielding effect.

As can been seen from the above explanation, the plug connector 10 according to the invention can bring about the following significant effects.

(1) In an electrical connector 1 including a plug connector 10 and a receptacle connector 40 detachably fitted with each other, according to the invention the plug connector 10 comprises a plurality of coaxial cables 14 each having a center conductor 141, an insulator 142 covering the center conductor 141, a braid 143 as an external conductor covering the insulator 142, and a sheath 144 covering the braid 143; a flexible printed circuit board 12 having lands 28 each connected to the center conductor 141 of the coaxial cable 14 and land portions 30 to which a ground bar 16 is connected; and the ground bar 16 having a main portion 22 adapted to contact the braids 143 and fixed portions 24 each positioned contiguously with the main portion 22 and connected to the land portion 30. With such a construction, it is possible to make the plug connector 10 to be of an extremely flat geometry such as a height less than 0.6 mm and hence the receptacle connector 40 to be of a flat geometry of the order of 1.0 mm. Moreover, the grand bar 16 and the coaxial cables 14 are in a merely contacting relationship to one another, so that any melting of the insulators 142 is precluded and hence any defective connection is eliminated.

(2) According to the invention, the receptacle connector 40 comprises a housing 42, contacts 44, locking lever 46, and a receptacle shell 48 covering the housing 42 except for its portion associated with the locking lever 46, and the receptacle shell 48 is provided on the side of a fitting opening 52 with at least one contacting means adapted to contact the upper surface of the ground bar 16 of the plug connector 10. Therefore, the ground bar 16 can be securely brought into contact with the receptacle shell 48 so that the coaxial cables 14 and a hard substrate can be easily brought into continuity relation, thereby providing the grounding.

(3) According to the invention, the ground bar 16 of the plug connector 10 is provided with projection pieces 26 which extend from the main portion 22 of the ground bar 16 and is adapted to contact the braids 143 at locations between the center conductors of all the coaxial cables 14 or at locations between the center conductors of every other coaxial cable 14. Therefore, the grounding of the ground bar 16 and the braids 143 can be easily achieved. Moreover, there is no need for soldering the projection pieces 26 and the braids 143, so that the risk of melting of the insulators 142 is eliminated, thereby completely preventing any failed connection.

(4) According to the invention, the ground bar 16 of the plug connector 10 is provided with projection pieces 26 which extend from the main portion 22 of the ground bar 16 and is adapted to contact the braids 143 at intervals of plural locations between the coaxial cables 14. In the same manner as described above, the grounding of the ground bar 16 and the braids 143 can be easily achieved, and there is no need for soldering the projection pieces 26 and the braids 143, so that the risk of melting of the insulators 142 is eliminated, thereby completely preventing any failed connection.

(5) According to the invention, the projection pieces 26 are in the form of a substantially L-shape. As a result, on putting the ground bar 16 onto the coaxial cables only, the projection pieces 26 in the form of comb teeth are inserted between the braids 143 of the coaxial cables 14, thereby easily providing the grounding of the ground bar 16 and the coaxial cables 14.

(6) According to the invention, the projection pieces 26 in the form of the substantially L-shape located at intervals of plural locations extend beyond the braids 143 and fixed to the flexible printed circuit board 12 by soldering. With this construction, the ground bar 16 is prevented from rising away from the coaxial cables 14, thereby ensuring stable grounding.

(7) According to the invention, the contacts 44 at both the ends of the receptacle connector 40 are each connected to the land portion 30. Accordingly, the continuity can be obtained between the ground bar 16 and the coaxial cables 14 or between the ground bar 16 and the hard substrate and hence the continuity can be easily realized between the coaxial cables 14 and the hard substrate, and the grounding of the coaxial cables 14 and the hard substrate is also possible.

(8) According to the invention, each of the contacts 44 of the receptacle connector 40 comprises a contact portion 441, a connection portion 443, an elastic portion 445 and a fulcrum portion 444 provided between the contact portion 441 and the connection portion 40, a pressure receiving portion 446 positioned opposed to the connection portion 443 and extending from the elastic portion 445, and a further contact portion 441 on the opposite side of the first mentioned contact portion 441, and the first mentioned contact portion 441, the elastic portion 445, the fulcrum portion 444 and the connection portion 443 are arranged in the form of a crank, and further the locking lever 46 of the receptacle connector 40 is provided with urging portions 461 successively in its longitudinal direction, and the locking lever 46 is installed in the housing 42 so that the urging portions 461 are each pivotally movable in the space between the connection portion 443 and the pressure receiving portion 446 of the contact 44. Accordingly, the receptacle connector 40 becomes of ZIF type (zero insertion force type) so that the plug connector 10 can be readily fitted in the receptacle connector 40, and the flat geometry of the receptacle connector 40 is also achieved.

(9) According to the invention, the receptacle connector 40 is provided with locking members 50 in the same construction as that of the contacts 44, and the flexible printed circuit board 12 is provided with anchoring portions 32 each at position corresponding to engaging portion 501 of the locking member 50. With this construction, even if the number of the coaxial cables 14 is fewer, the stable holding force can be obtained when the plug and receptacle connectors 10, 40 are fitted with each other.

(10) According to the invention, as the contact means of the receptacle shell 48 there is provided a protrusion 56 extending into the fitting opening 52 or an elastic piece 57 having an elasticity extending into the fitting opening 52.

Accordingly, the grand bar 16 can be more securely brought into contact with the receptacle shell 48 and the continuity therebetween can be easily achieved.

(11) According to the invention, the ground bar is provided with protrusion pieces 27 contiguously with the main portion 22 of the ground bar 16 at predetermined positions on the surface to contact the coaxial cables 14 so that the protrusion pieces are each adapted to pierce into the coaxial cable 14, thereby causing each the protrusion piece 27 to contact the center conductor 141 and the braid 143 of the coaxial cable 14. With such a construction, the shielding effect can be obtained between the predetermined coaxial cables 14 and also between the predetermined lands 28 of the flexible printed circuit board 12.

(12) According to the invention, the protrusion pieces of the ground bar are so arranged that they pierce every other or every third coaxial cable. Therefore, the grounding and hence the shielding effect are also obtained even between the every other coaxial cable 14 or between the every third coaxial cable 14. Further, the grounding and hence the shielding effect are also obtained even between the predetermined lands 28 of the flexible printed circuit board 12.

(13) According to the invention, the protrusions extending from the fixed portions of the ground bar abut against the flat portion of the housing of the receptacle connector, when the plug connector erroneously turned upside down is being inserted into the receptacle connector. Therefore, the erroneous insertion of the plug connected into the receptacle connector can be prevented with the simple construction before the contacts of both the connectors contact each other even with a flexible printed circuit board having contact portions on its opposite sides. Accordingly, the erroneous insertion of plug connector upside down can be prevented with great certainty, thereby completely avoiding any failed connection.

(14) According to the invention, the protrusions are substantially L-shaped to ensure that the L-shaped portions abut against the flat portions of the housing. Therefore, the erroneous insertion of the plug connector turned upside down can be readily prevented.

(15) According to the invention, there are provided the required number of locking members depending upon required holding forces for plug and receptacle connectors. Accordingly, the holding forces can be assured according to specifications or customers demands.

BRIEF DESCRIPTION OF THE DRAWINGS

FIG. 7B is a perspective view illustrating the coaxial cables into which the protrusion pieces pierce and whose center conductors are soldered to lands of a flexible printed circuit board;

DESCRIPTION OF THE REFERENCE NUMERALS

Figure 1:
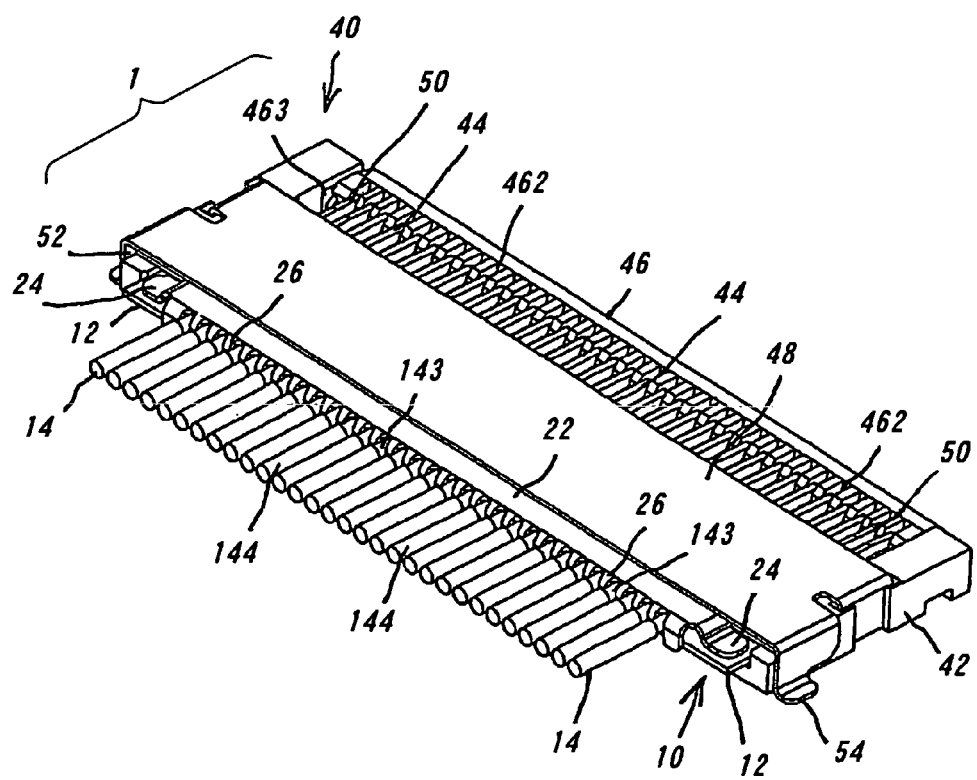
FIG. 1 is a perspective view of a plug connector and a receptacle connector fitted with each other according to the invention.

1, 5 Electrical connector
10, 60 Plug connector
12 Flexible printed circuit board
14 Coaxial cable
141 Center conductor
142 Insulator
143 braid
144 Sheath
16, 66 Ground bar
22 Main portion
24 Fixed portion
26 Projection piece
27 Protrusion piece
28 Land
30 Land portion
32 Anchoring portion
40, 80 Receptacle connector
42, 82 Housing
43 Insertion groove
44 Contact
441 Contact portion
442, 502 Fixed portion
443, 503 Connection portion
444, 504 Fulcrum portion
445, 505 Elastic portion
446, 506 Pressure receiving portion
447 Projection
46 Locking lever 461 Urging portion
462 Anchoring aperture
463 Shaft
48, 88 Receptacle shell
50 Locking member
501 Engaging member
507 Extending portion
508 Groove
509 Flat portion
52 Fitting opening
54 Fixing tab
56 Protrusion
57 Elastic piece
58 Slit
62 Block
64 Plug contacts
641 Contact portion
643 Connection portion
68 Plug shell
70 Inserting hole
72 Fitting portion
74 Loading portion
76 protrusion
78 Anchoring piece
79 Contact piece
90 Extension portion
92 Protrusion
94 Flat portion

BEST MODE FOR CARRYING OUT THE INVENTION

Figure 2:
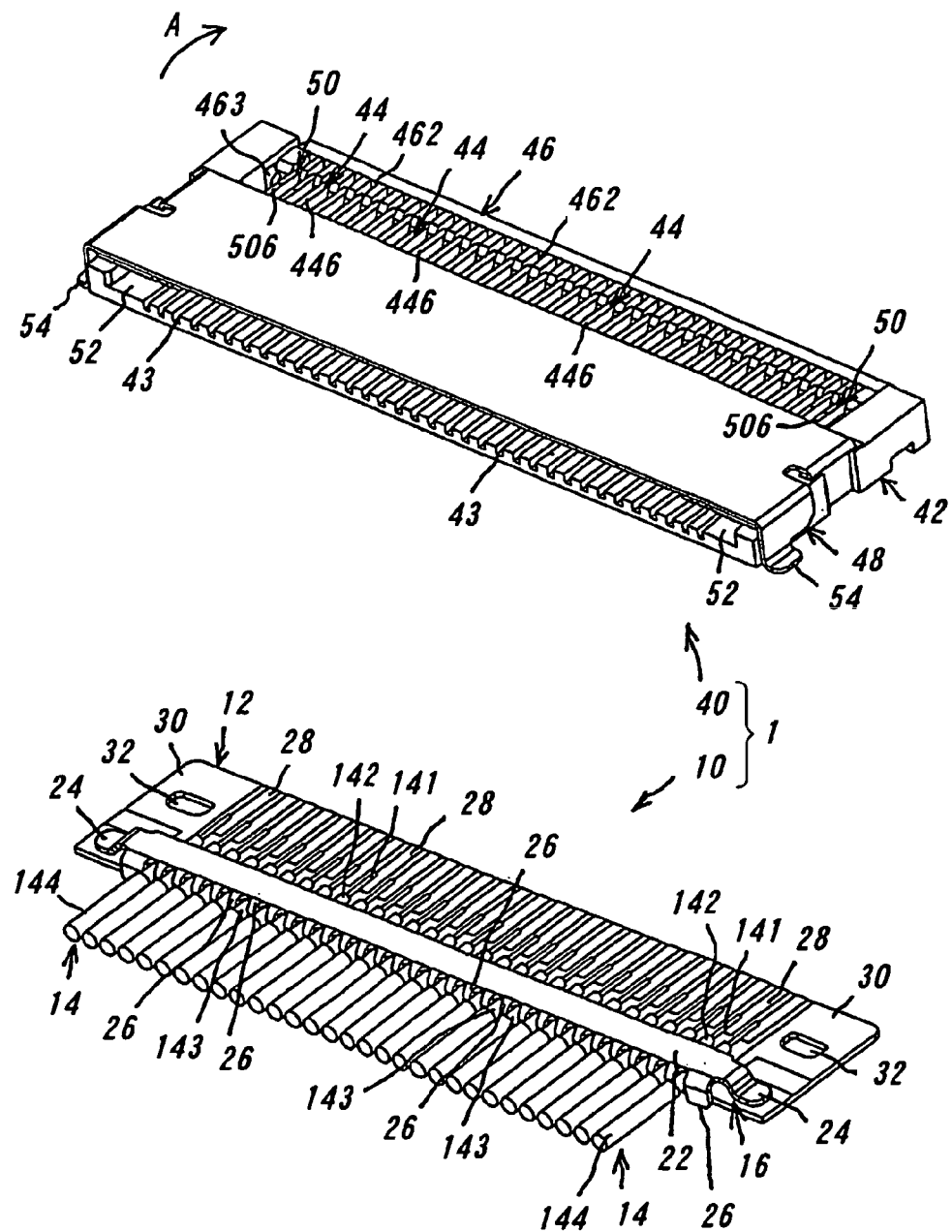
FIG. 2 is a perspective view of the plug connector and the receptacle connector before being fitted with each other according to the invention.
Figure 3:
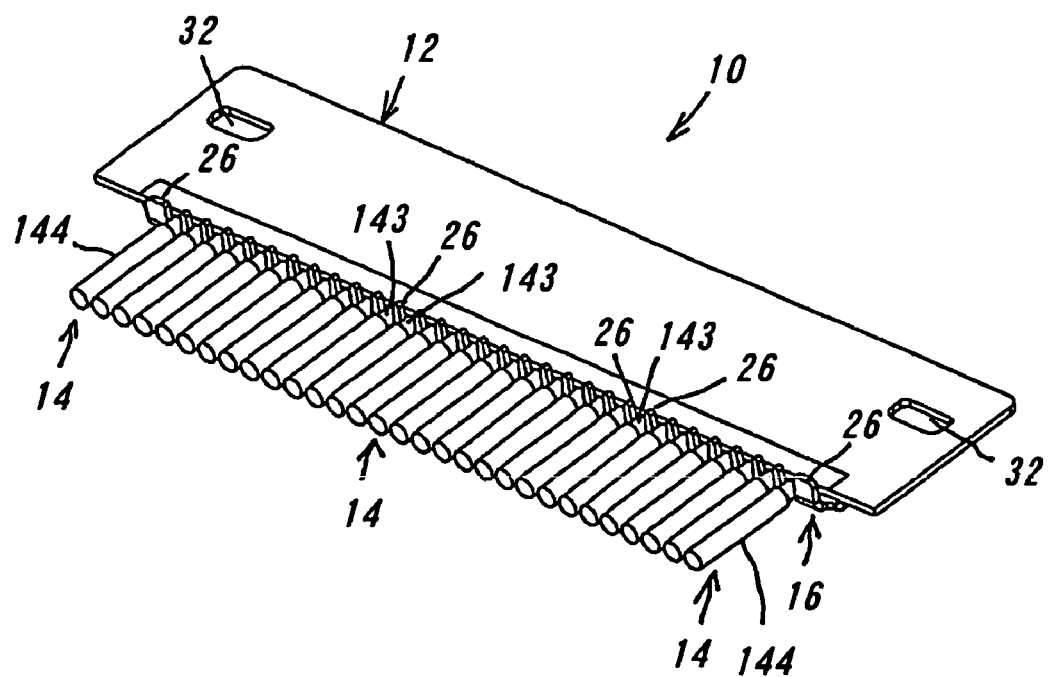
FIG. 3 is a perspective view of the plug connector shown in FIG. 2, being turned upside down.
Figure 4A:
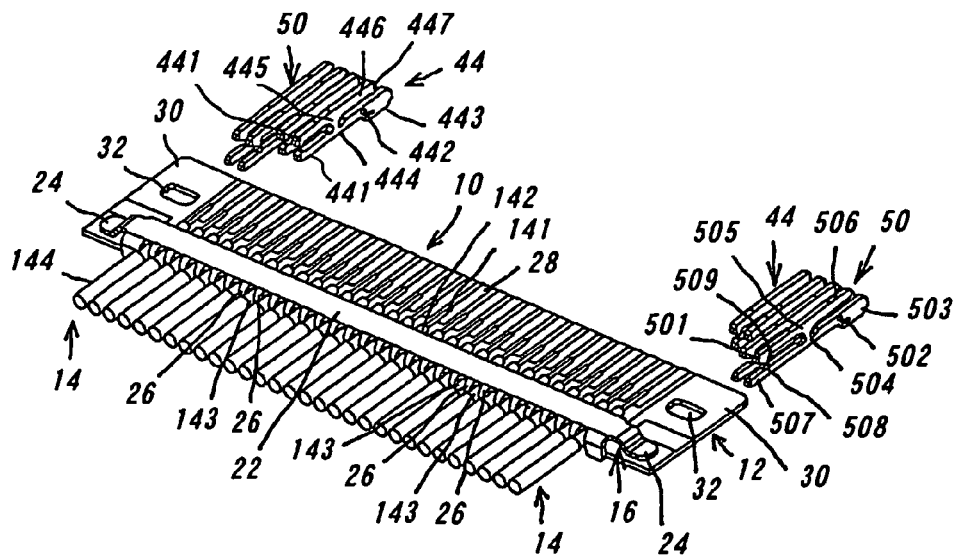
FIG. 4A is a perspective view of the plug connector and contacts and locking members of the receptacle connector according to the invention.
Figure 4B:
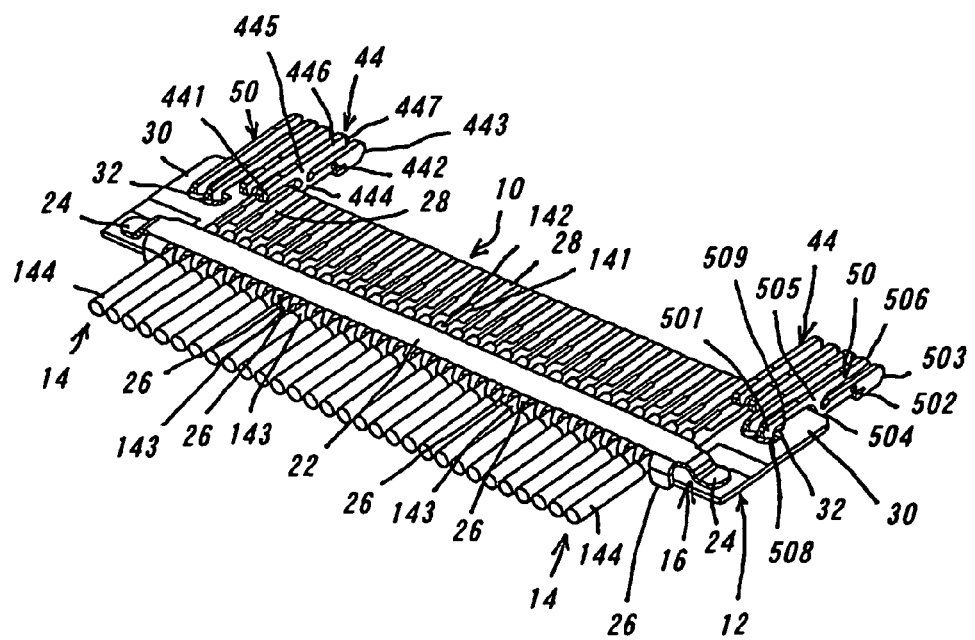
FIG. 4B is a perspective view illustrating the state of the contacts and locking members in contact with the plug connector shown in FIG. 4A.
Figure 5:
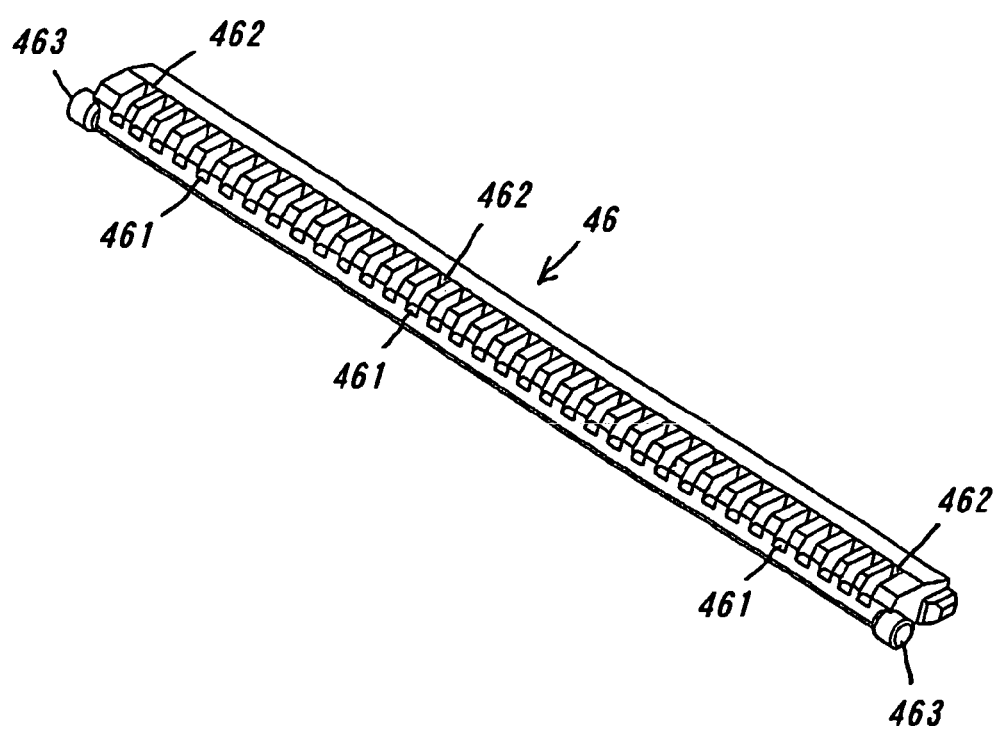
FIG. 5 is a perspective view of a locking lever as a single entity of the receptacle connector according to the invention.
Figure 6A:
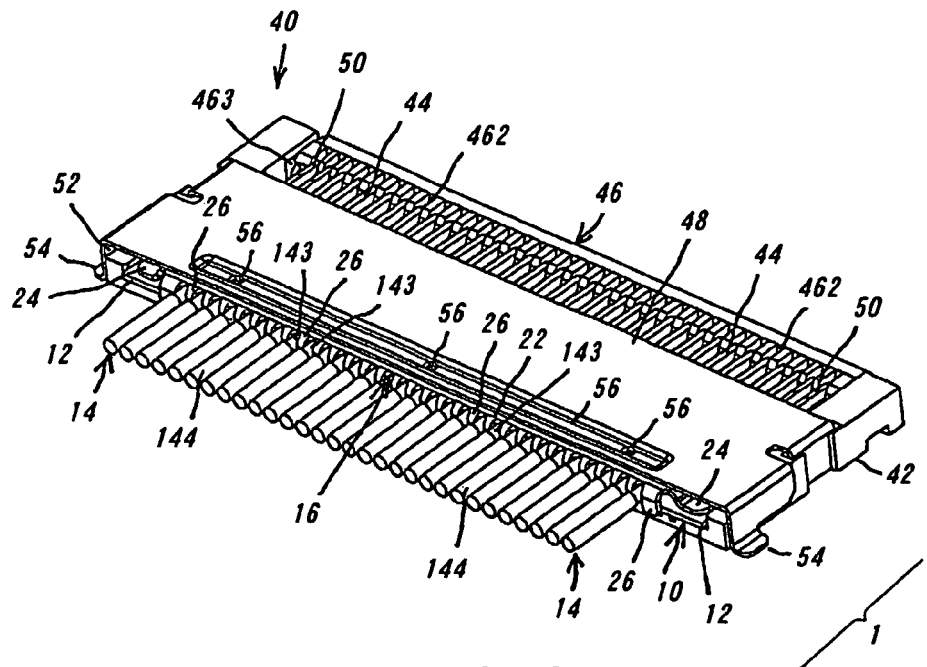
FIG. 6A is a perspective view of a receptacle connector and a plug connector fitted with each other according to another embodiment of the invention.
Figure 6B:
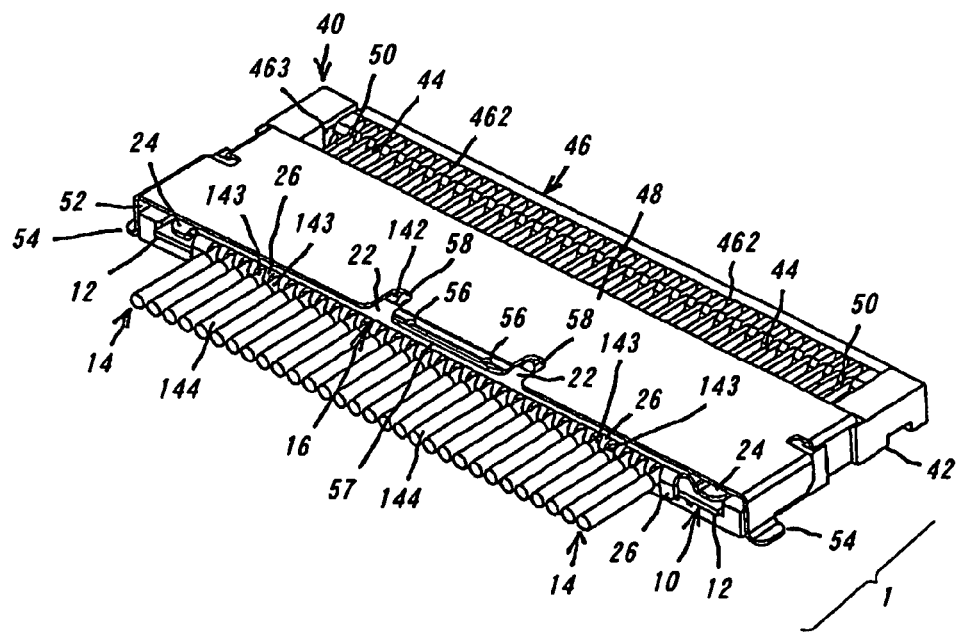
FIG. 6B is a perspective view of a receptacle connector and a plug connector fitted with each other according to a further embodiment of the invention.
Figure 7A:
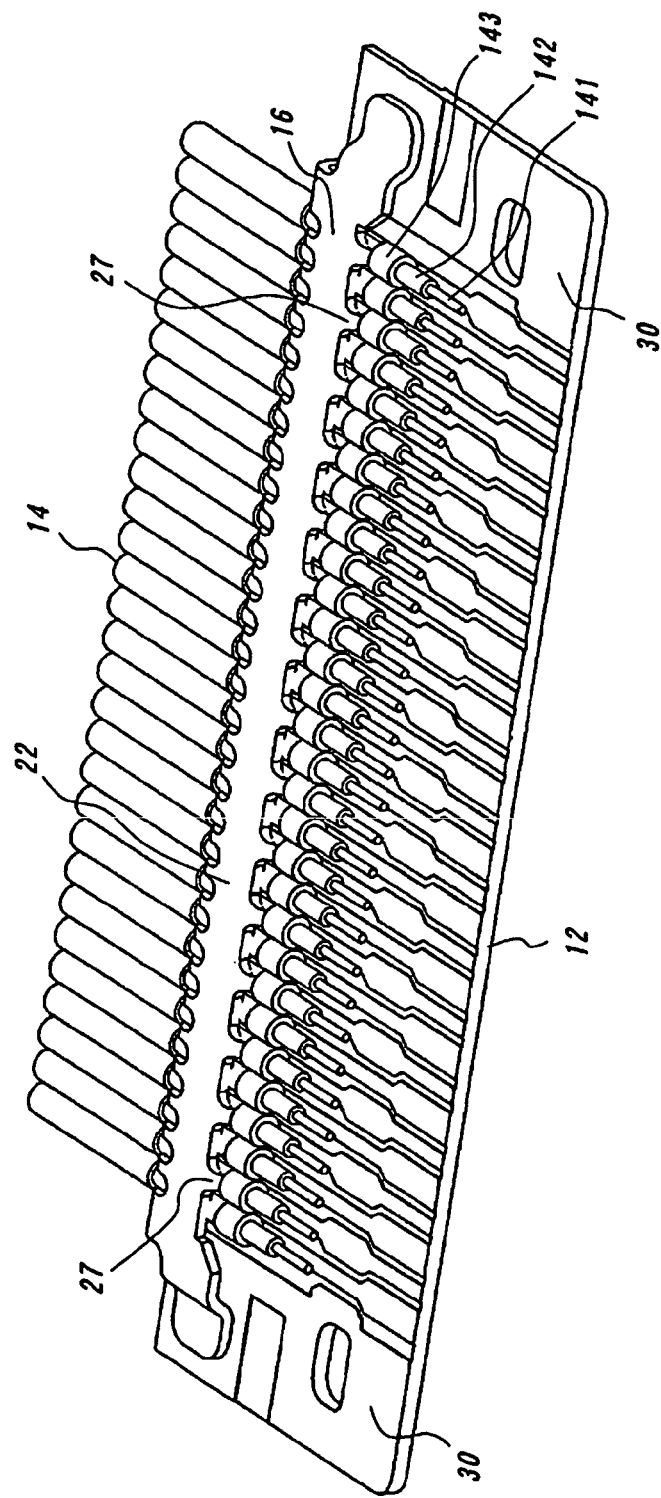
FIG. 7A is a perspective view illustrating a ground bar having protrusion pieces of the ground bar piercing into coaxial cables.

An electrical connector according to one embodiment of the invention will be explained with reference to the drawings. The electrical connector 1 comprises a plug connector 10 and a receptacle connector 40 which are to be detachably fitted with each other. FIG. 1 illustrates in a perspective view the plug connector and the receptacle connector according to the invention fitted with each other. FIG. 2 shows in a perspective view the plug connector and the receptacle connector according to the invention prior to the fitting with each other. FIG. 3 is a perspective view illustrating the plug connector in FIG. 2 being turned upside down. FIG. 4A is a perspective view illustrating the plug connector and contacts and locking members of the receptacle connector according to the invention, and FIG. 4B is a perspective view illustrating the contacts and locking members of the receptacle connector, which are in contact with the plug connector according to the invention. FIG. 5 illustrates only the locking lever of the receptacle connector. FIG. 6A illustrates in a perspective view a receptacle connector and a plug connector fitted with each other according to another embodiment of the invention, and FIG. 6B illustrates in a perspective view a receptacle connector and a plug connector fitted with each other according to a further embodiment of the invention. FIG. 7A is a perspective view illustrating a ground bar having protrusion pieces piercing into coaxial cables, and FIG. 7B is a perspective view illustrating the coaxial cables into which the protrusion pieces pierce and whose center conductors are soldered to lands of a flexible printed circuit (FPC) board.

The plug connector 10 of one embodiment of the invention mainly comprises coaxial cables 14, a flexible printed circuit board 12 and a ground bar 16. The receptacle connector 40 of the one embodiment mainly comprises a housing 42, contacts 44, a locking lever 46, locking members 50 and a receptacle shell 48.

The components of the respective connectors 10 and 40 will be explained hereinbelow. First, the construction of the plug connector 10 will be explained. With the plug connector 10, the coaxial cables 14 are directly connected to the flexible printed circuit board 12 and the ground bar 16 is brought into contact with the braids 143 of the coaxial cables 14, thereby providing a grounding or earthing.

The construction of the coaxial cables 14 will be explained. Each of the coaxial cables 14 mainly comprises a center conductor 141, an insulator 142, a braid 143 as an external conductor, and a sheath 144. The center conductor 141 made of a metal is adapted to be connected to the flexible printed circuit board 12 and covered by the insulator 142 thereabout. The insulator 142 serves to insulate between the center conductor 141 and the braid 143 as an external conductor. The insulator 142 is covered by the braid 143 as the external conductor. These braids 143 are connected to the ground bar 16 to provide the grounding and covered therearound by the sheath 144 made of an insulating material such as vinyl chloride.

Prior to being connected to the flexible printed circuit board 12, the coaxial cables 14 are pre-treated in the following manner. First, the sheath 144 is removed over a predetermined length and the front portion of the insulator 142 is then removed to expose the center conductor 141 of a predetermined length. Finally, the braid 143 is partly removed to leave the braid 143 of a predetermined length, while taking care enough to avoid any contact between the center conductor 141 and the braid 143.

The flexible printed circuit board 12 will then be explained. The flexible printed circuit board 12 is substantially rectangular of 15.1 mm length, 3.05 mm width and 0.12 mm thickness in the illustrated embodiment. The flexible printed circuit board 12 mainly comprises a required number of lands 28 each adapted to be connected to the center conductor 141 and thus adapted to be connected to the contact 44 of the receptacle connector 40, land portions 30 connected to fixed portions 24 of the ground bar 16 and adapted to contact the contacts 44 at the longitudinally distal ends of the receptacle connector 40, respectively and anchoring portions 32 adapted to engage engaging portions 501 of the locking members 50, respectively. The lands 28 may be arranged with a pitch corresponding to that of the coaxial cables 14. The lands 28 has a size suitably designed such that they can be connected to the center conductors 141 (by soldering) with a sufficient connecting strength without giving rise to any defective connection and can contact the contacts 44 of the receptacle connector 40 in a stable manner without any failed connection. In the illustrated embodiment, the lands 28 are of 1.9 mm length and 0.25 mm width with 0.4 mm pitch.

The distance between the land portions 30 may be suitably designed in consideration of the number of the coaxial cables 14 and the fact that the contacts 44 at both the ends of the receptacle connector 40 contact the land portions 30, respectively. In the illustrated embodiment, the number of the coaxial cables 14 is thirty (30) and the distance between the land portions 30 is 12.4 mm. The contacts 44 at both the distal ends of the receptacle connector 40 contact the land portions 30 and the fixed portions 24 of the ground bar 16 are connected to the land portions 30. Therefore, the size of the land portions 30 may be designed such that the fixed portions 24 of the ground bar 16 can be connected to the land portions 30 with a sufficient connection strength and the contacts 44 at both the distal ends of the receptacle connector 40 can contact the land portions 30 in a stable way without giving rise to any failed connection. In the illustrated embodiment, the land portions 30 are of 3.05 mm length and 1.5 mm width.

The anchoring portions 32 are adapted to engage the engaging portions 501 of the locking members 50 so that the shape of the anchoring portions 32 may be any one permitting the engagement of the anchoring portions 32 with the engaging portions 501 of the locking members 50. The anchoring portions 32 may be a U-shaped notch, a through-hole, or a blind hole. In the illustrated embodiment, the anchoring portions 32 are each an elliptical through-hole as shown in FIGS. 2 to 4 in which the two locking members 50 engage, in order to enhance the holding force when the plug and receptacle connectors are fitted with each other.

The ground bar 16 will then be explained which is a subject feature of the invention. The ground bar 16 is made by the known press-working from a metal which may be phosphor bronze, beryllium copper, or brass in consideration of workability, dimensional stability, conductivity and ease in plating. The ground bar 16 comprises a main portion 22 adapted to contact the braids 143 of the coaxial cables 14, and the fixed portions 24 at the longitudinal ends contiguous to the main portion 22 and adapted to be connected to the land portions 30. The size of the main portion 22 depends upon the number of the coaxial cables 14 and may be suitably designed so as to be able to contact the braids 143 of all the coaxial cables 14. In the illustrated embodiment with the thirty coaxial cables, the ground bar 16 is of 13.2 mm length and 0.65 mm width. The distance between the fixed portions 24 at both the ends of the ground bar 16 is 13 mm in the embodiment which depends upon the number of the coaxial cables. The size of the fixed portions 24 is 0.5 mm length and 0.4 mm width in the embodiment, which may be suitably designed in consideration of the connection strength to the flexible printed circuit board 12.

The position at which the ground bar 16 is fixed to the land portions 30 may be suitably designed such that the ground bar 16 is brought into contact with the braids 143 of the coaxial cables 14 under the condition that the center conductors 141 of the coaxial cables 14 are connected to the lands 28 of the flexible printed circuit board 12.

There may be a possibility that no stable grounding is possible by merely bringing the main portion 22 of the ground bar 16 into contact with the braids 143 of the coaxial cables 14. Therefore, the main portion 22 of the ground bar 16 is provided with projection pieces 26 protruding from the main portion 22 at positions corresponding to those between the center conductors of the coaxial cables 14 with the same pitch as that of the coaxial cables 14, or with a pitch equal to every other or every third coaxial cable, or at intervals of plural coaxial cables. According to the illustrated embodiment, in order to ensure a more stable grounding, the projection pieces are provided between all the center conductors and have a substantially L-shape so that the projection pieces securely penetrate between the coaxial cables 14 when the ground bar 16 is merely put on the coaxial cables 14. The size of the projection pieces 26 may be suitably designed in consideration of their strength, the pitch of the coaxial cables 14 and the grounding resulting from the contact with the braids 143. In the illustrated embodiment, the projection pieces 26 are of 0.17 mm width and 0.45 mm length. By providing the projection pieces 26, they penetrate between the coaxial cables 14 so that the projection pieces 26 and the braids 143 can be connected without using soldering, thereby precluding any failed connection.

In order to fix the ground bar 16 to the flexible printed circuit board 12 more rigidly, moreover, projection pieces 26 are further provided at both the longitudinal ends. Such projection pieces 26 provided at both the ends of the ground bar 16 may have a width which is of the order of 0.3 mm larger than that of the normal projection pieces 26 because the projection pieces 26 at both the ends are not under the influence of the pitch of the coaxial cables 14.

In order to prevent the ground bar 16 from rising away from the coaxial cables 14, a required number of the substantially L-shaped projection pieces 26 extend further beyond the braids 143 of the coaxial cables 14 to the opposite side of the flexible printed circuit board 12 whereupon the extended ends of the pieces are soldered to the opposite side of the board 12. The "required number" is here understood as signifying the number enough to prevent the rising of the ground bar 16. In the embodiment, every eleventh piece is soldered in the interest of safety.

With increasingly higher transmission speed, in order to enhance the shielding, the following approach has been taken according to the invention. The ground bar 16 is provided with protrusion pieces 27 contiguously therewith at predetermined positions on the surface of the main portion 22 of the ground bar 16 adapted to contact the coaxial cables 14. When the ground bar 16 is put on the coaxial cables 14, the protrusion pieces 27 each pierce into the coaxial cable 14 so that the protrusion piece 27 will contact the center conductor 141 and the braid 143 of the coaxial cable 14 as shown in FIGS. 7A and 7B. The size of the protrusion pieces 27 may be suitably designed in consideration of the diameter of the coaxial cables 14 and the function described above, strength, and worked accuracy of the protrusion pieces 27. In the embodiment with the coaxial cables 14 of 0.3 mm diameter, the protrusion pieces 27 extend of the order of 0.20 mm from the main portion. The shape of the protrusion pieces 27 may be suitably designed in consideration of the piercing power of the pieces in addition to the same factors considered when the size of the protrusion pieces 27 is determined. In the illustrated embodiment, their shape is tapered toward its tip end in order to easily pierce into the cable. The term "at predetermined positions" is here understood as signifying "at any suitable positions" such as at every other or every third coaxial cable, or at intervals of plural coaxial cables. In the illustrated embodiment, the protrusion pieces are provided at every other coaxial cable 14 so as to pierce thereinto as shown in FIG. 7A. Also, the protrusion pieces 27 may be provided at every third coaxial cable depending on the arrangement of signal lines. When the protrusion pieces 27 each pierce into the coaxial cable 14 to bring the protrusion piece 27 into contact with the center conductor 141 and the braid 143, the shielding effect can be enhanced, and further the shielding effect between the lands 28 of the flexible printed circuit board 12 can be obtained.

The receptacle connector 40 according to the invention will then be explained. First, its housing 42 will be explained. The housing 42 is made by the known injection molding from an insulating plastic material such as polybutylene terephthalate (PBT), polyamide (66PA or 46PA), liquid crystal polymer (LCP) and polycarbonate (PC) and combination thereof, suitably selected in view of the requirements imposed of the housing with respect to dimensional stability, workability, manufacturing cost and the like.

The housing 42 is formed with insertion grooves 43 into which a required number of contacts 44 are installed by press-fitting, lancing or hooking, welding or the like. The housing 42 is also provided with a fitting opening 52 for inserting the plug connector 10 (the flexible printed circuit board 12). The size of the fitting opening 52 is suitably designed so that the flexible printed circuit board 12 can be inserted and the flexible printed circuit board 12 is urged against the contacts 44 by means of the locking lever 46 when the flexible printed circuit board 12 has been inserted into the housing 42. The housing 42 is provided at its longitudinal ends with bearings for rotatably supporting shafts 463 of the locking lever 46. The shape and size of the bearings may be arbitrarily selected insofar as the shafts 463 of the locking lever 46 are rotatable in the bearings and may be suitably designed in consideration of the function of the bearings and the strength and size of the housing 42. Moreover, the housing 42 is provided at longitudinal ends with anchoring portions at positions corresponding to those of locking portions of the locking lever 46.

The contacts 44 will then be explained. The contacts 44 are made by the known press-working from a metal such as brass, beryllium copper, phosphor bronze and the like to fulfil the requirements imposed thereon, springiness, conductivity and the like.

The contacts 44 have a substantially H-shape and each mainly comprise contact portions 441 adapted to contact the flexible printed circuit board 12, a connection portion 443 to be connected to a board, a fixed portion 442 to be fixed to the housing 42, an elastic portion 445 and a fulcrum portion 444 provided between the contact portions 441 and the connection portion 443, a pressure receiving portion 446 positioned opposed to the connection portion 443 and extending from the elastic portion 445, and further contact portion 441 extending from the fulcrum portion 444 and adapted to contact the flexible printed circuit board 12. The upper contact portions 441, the elastic portion 445, the fulcrum portion 444 and the connection portion 443 are arranged in the form of a crank. The contact portions 441 have a protrusion shape to make easy the contact with the flexible printed circuit board 12. Although the connection portion 443 is of a surface mounting type (SMT) as shown in FIG. 4, it will be apparent that it may be of a dip type. In the illustrated embodiment, the two contact portions 441 are provided to embrace the flexible printed circuit board 12 therebetween. The two contact portions 441 are arranged on upper and lower sides of the flexible printed circuit board 12 so that the board 12 is embraced by the two contact portions 441 to ensure the contact between the board 12 and the contacts 44.

The fulcrum portion 444, the elastic portion 445 and the pressure receiving portion 446 function in the following manner when the flexible printed circuit board 12 is inserted. After the flexible printed circuit board 12 has been inserted into the fitting opening 52 of the housing 42 of the receptacle connector 40, when the locking lever 46 is pivotally moved about its shafts 463 to pivotally move the urging portions 461 of the locking lever 46 in the space between the connection portions 443 and the pressure receiving portions 446 of the contacts 44, the pressure receiving portions 446 are urged upwardly by the urging portions 461 so that the elastic portions 445 of the contacts 44 are tilted about the fulcrum portions 444 toward the contact portion 441, thereby urging the contact portions 441 against the flexible printed circuit board 12. The sizes and shapes of the fulcrum portion 444, the elastic portion 445 and the pressure receiving portion 446 may be suitably designed for achieving such their functions. The pressure receiving portion 446 of the contact 44 is preferably provided at its distal end with a projection 447 which is brought into engagement with an anchoring aperture 462 of the locking lever 46 when the urging portions 461 of the locking lever 46 are pivotally moved in the space between the pressure receiving portions 446 and the connection portions 443 of the contacts. The engagement of the projection 447 with the anchoring aperture 462 will prevent the locking lever 46 from being deformed at its center due to strong reaction against the pivotal movement of the locking lever 46. The size of the projection 447 may be any one insofar as it serves to achieve the purpose described above, and may be suitably designed so as to engage the anchoring aperture 462 of the locking lever 46.

While the contacts 44 are shown in the form of a substantially H-shape, it will be apparent that they may be in the form of a substantially h-shape (not shown) in which there is no contact portion 441 extending from the fulcrum portion 444 and adapted to contact the flexible printed circuit board.

The locking lever 46 will then be explained. The locking lever 46 is made by the known injection molding from an insulating plastic material such as polybutylene terephthalate (PBT), polyamide (66PA or 46PA), liquid crystal polymer (LCP) and polycarbonate (PC) and combination thereof, suitably selected in view of the requirements imposed with respect to dimensional stability, workability, manufacturing cost and the like. The locking lever 46 mainly comprises shafts 463 rotatably fitted in the housing 42, the urging portions 461 each adapted to urge the pressure receiving portion 446 of the contact 44, and the anchoring apertures 462 each adapted to engage the projection 447 of the contact 44. The shafts 463 are rotatably fitted in both the ends of the housing 42 so as to be fulcrums for pivotally moving the locking lever 46. The locking lever 46 is further provided at both the ends with locking portions adapted to engage the housing 42 for preventing the locking lever 46 from rising away from the contacts when the locking lever 46 urges the pressure receiving portions 446 of the contacts 44. The shape and size of the locking portions may be arbitrary so long as they can engage the housing 42 and may be suitably designed in consideration of the function described above and the size and strength of the connector.

The urging portions 461 of the locking lever 46 are each adapted to be urged against the pressure receiving portion 446 of the contact 44 and their shape is preferably elongated and elliptical in the illustrated embodiment. With such an elliptical shape, when the locking lever 46 is pivotally moved to move the urging portions 461 in the space between the pressure receiving portions 446 and the connection portions 443 of the contacts 44 so that the pressure receiving portions 446 of the contacts 44 are raised with variation in contact height owing to the elliptical shape of the urging portions 461, thereby urging the contact portions 441 of the contacts 44 against the flexible printed circuit board 12. The urging portions 461 may be any shape insofar as they can be pivotally moved in the space between the pressure receiving portions 446 and the connection portions 443 of the contacts 44 and the pressure receiving portion 446 of the contacts can be raised with the aid of the variation in size such major and minor axes of an ellipse.

As described above, in order to prevent the locking lever 46 from being outwardly deformed at its middle due to the reaction force against the pivotal movement of the locking lever 46, the locking lever 46 is provided with the anchoring apertures 462 independently from one another with which the projections 447 of the contacts 44 engage, respectively. The placement of the anchoring apertures 462 independent from one another serves to maintain the strength of the locking lever 46 and prevent the locking lever 46 from deforming on being pivotally moves.

The locking lever 46 is mounted on the housing 42 on the opposite side of its fitting opening 52 in a pivotally moving manner to achieve potentially the lower geometry in height of the connector.

The receptacle shell 48 will then be explained. The receptacle shell 48 is made by the known press-working also from a metal such as brass, beryllium copper, phosphor bronze and the like to fulfil the requirements imposed thereon, workability, dimensional stability, conductivity, ease in plating, and the like. The receptacle shell 48 provides shielding effect to the receptacle connector 40 and is mounted thereon in a manner covering the housing 42 except for the locking lever 46. The receptacle shell 48 is provided at both longitudinal ends with fixing tabs 54 for fixing the receptacle shell 48 of the receptacle connector 40 to a hard substrate. The fixing tabs 54 are fixed to the hard substrate by soldering as by reflow soldering simultaneously with the installation of the contacts 44 and the locking member 50. The fixing tabs 54 are provided to enable the connected strength of the receptacle connector 40 to be enhanced. The size of the fixing tabs 54 may be suitably designed in consideration of the connected strength of the receptacle connector 40 and occupied area on the hard substrate. The fixing tabs 54 in the illustrated embodiment are of 0.7 mm×0.35 mm size.

Finally, the locking members 50 will be explained. The locking members 50 are made by the known press-working from a metal in the similar manner to the contacts 44. Preferred metals from which to form the locking members 50 include brass, beryllium copper, phosphor bronze and the like which fully comply with the imposed requirements such as the springiness, moldability and the like.

In the illustrated embodiment, the locking members 50 have a substantially H-shape similar to that of the contacts 44 and each mainly comprise engaging portions 501 adapted to engage the anchoring portions 32 of the flexible printed circuit board 12, connection portion 503 to be connected to the board, a fixed portion 502 to be fixed to the housing 42, an elastic portion 505 and a fulcrum portion 504 provided between the engaging portion 501 and the connection portion 503, a pressure receiving portion 506 extending from the elastic portion 505, and extending portions 507 from the fulcrum portion 504 in the direction opposite to the connection portion 503. The engaging portions 501, the elastic portion 505, the fulcrum portion 504, and the connection portion 503 are arranged substantially in the form of a crank. Moreover, the locking member 50 is provided with grooves 508 at positions corresponding to the engaging portions 501 when they engage the anchoring portion 32 of the flexible printed circuit board 12. The shape and size of the grooves 508 may be suitably designed in consideration of the strength of the locking member 50 and so as to achieve the engaging relation between the flat portions 509 of the engaging portions 501 and the anchoring portion 32 when the engaging portions 501 of the locking member 50 engage the anchoring portion 32 of the flexible printed circuit board 12. The radius of the rounded distal ends of the engaging portions 501 may be suitably designed in consideration of the strength and so as to achieve the engaging relation described above. In the illustrated embodiment, the groove 508 is of 0.08 mm depth and is a curved recess, and the radius of the rounded distal ends of the engaging portion 501 is 0.05 mm. The connection portion 503 in the illustrated embodiment is shown of a surface mounting type (SMT), but it may be of a dip type.

The elastic portion 505, the fulcrum portion 504, the pressure receiving portion 506, and connection portion 503 have the same functions and effects as those in the contacts 44.

The engaging portions 501 of the locking member 50 are provided at positions corresponding to the anchoring portion 32 of the flexible printed circuit board 12. The locking members 50 are each fixed to the housing 42 by press-fitting, lancing or hooking or the like such that the connection portion 503 of the locking member 50 is located on the opposite side of the fitting opening 52 of the housing 42, thereby enabling the engaging portions 501 to engage the anchoring portion 32. The size of the engaging portions 501 may be suitably designed to obtain required holding force sufficiently, and the shape of the engaging portions 501 may be any one insofar as they can engage the anchoring portion 32 of the flexible printed circuit board 12. In the illustrated embodiment, the engaging portion is substantially in the form of a right angled triangle in consideration of the holding force so that its vertical surface is caused to contact the surface of the anchoring portion 32 of the flexible printed circuit board 12. Namely, the groove 508 is provided so that the flat portions 509 of the engaging portion 501 engage the anchoring portion 32 when the engaging portions 501 of the locking member 50 engage the anchoring portion 32 of the flexible printed circuit board 12, thereby ensuring the engagement of the locking member 50 with the flexible printed circuit board 12 without disengagement of the locking member 50. In the illustrated embodiment, as shown in FIGS. 4A and 4B, there are provided two locking members 50 at each end, that is, there are totally four locking members 50 in order to more increase the holding force when the plug and receptacle connectors 10 and 40 are fitted with each other.

In the illustrated embodiment, the engaging portions 501 do not engage the anchoring portion 32 when the flexible printed circuit board 12 is inserted into the fitting opening 52 of the housing 42, but the engaging portions 501 will engage the anchoring portion 32 when the flexible printed circuit board 12 is urged against the contacts 44 by means of the locking lever 46.

Another receptacle connector 40 according to the invention will be explained with reference to FIGS. 6A and 6B. The receptacle connector 40 now explained comprises a housing 42, contacts 44, and locking members 50 which are substantially similar to those described above. A receptacle shell 48 only will be explained which is different from the receptacle shell described above. Forming the subject feature of this receptacle connector 40 is at least one contact means provided at a fitting opening 52 of the receptacle shell 48 and adapted to contact the upper surface of a ground bar 16 of a plug connector 10. With the contact means, the receptacle shell 48 and the ground bar 16 are securely caused to contact each other to ensure the continuity across the plug and receptacle connectors 10 and 40 and hence across coaxial cables 14 and a hard substrate, thereby providing grounding.

The contact means can be realized in the following manner. There are provided in the fitting opening 52 protrusions 56 extending into the fitting opening 52 as the contact means. Only one protrusion 56 may be enough to be sure to contact the ground bar 16 of the plug connector 10. In the illustrated embodiment, three protrusions 56 are provided in consideration of stability of contact and balancing when being fitted. The extending distance of the protrusion 56 may be suitably designed in consideration of fitting of the plug and receptacle connectors 10 and 40 and contact pressure and fitting (fitting power) between the receptacle shell 48 and the ground bar 16. As a result, the protrusions 56 preferably extend of the order of 0.18 mm. It is unfavorable to cause the protrusion 56 to extend 0.18 mm at a time in forming step, as considering the workability and strength of the receptacle shell 48. In the illustrated embodiment, therefore, as shown in FIG. 6A the protrusions 56 are caused to extend 0.1 mm in a rectangular shape and further to extend 0.08 mm in a circular shape. The shape of the protrusions 56 may be arbitrary insofar as the receptacle shell 48 and the ground bar 16 can contact each other, such as hemispherical, triangular pyramidal and simply extending shape. In the illustrated embodiment, the hemispherical protrusions are used in consideration of stability of contact and balancing when being fitted.

Figure 8:
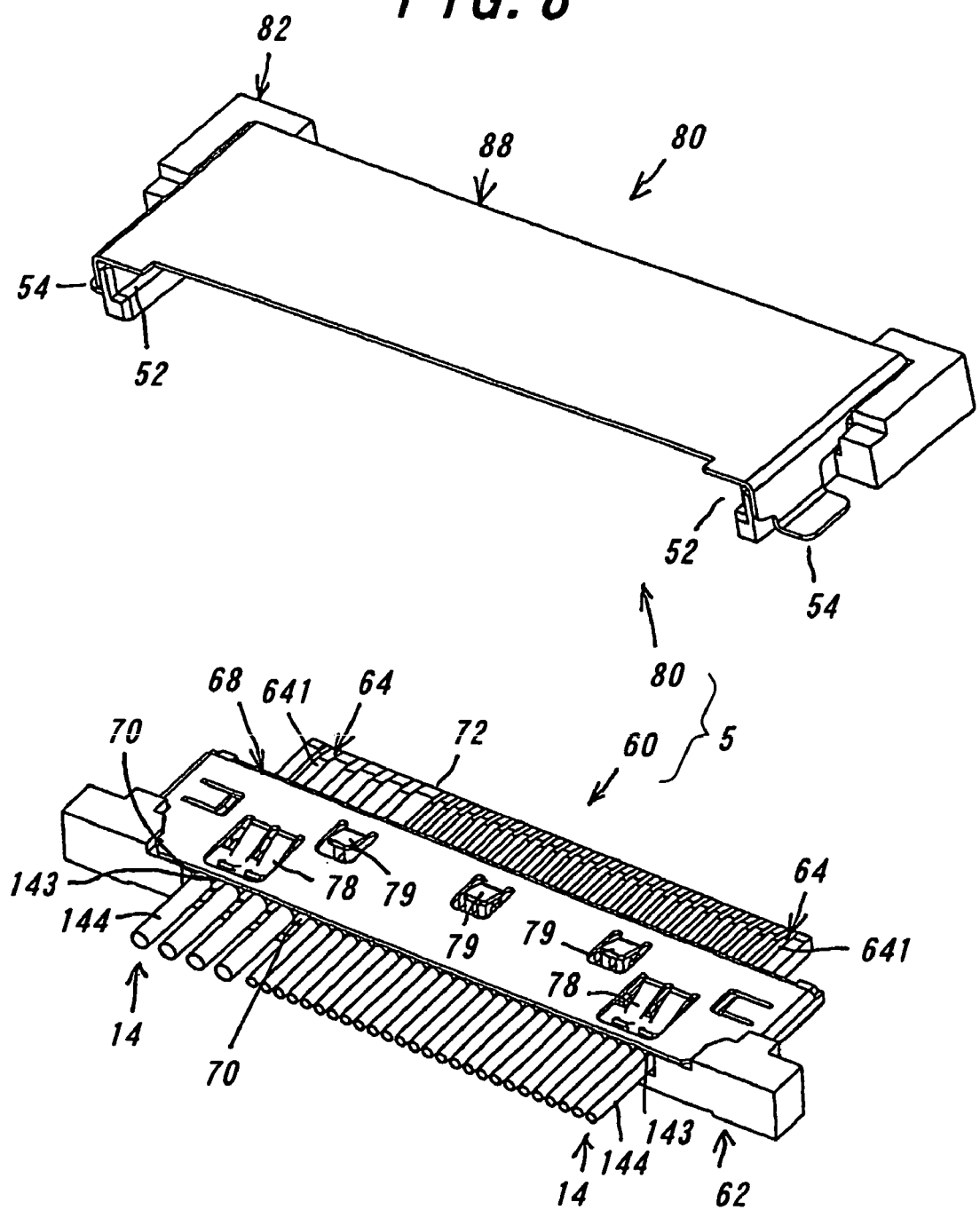
FIG. 8 is a perspective view of a plug connector and a receptacle connector of the prior art before being fitted with each other.
Figure 9:
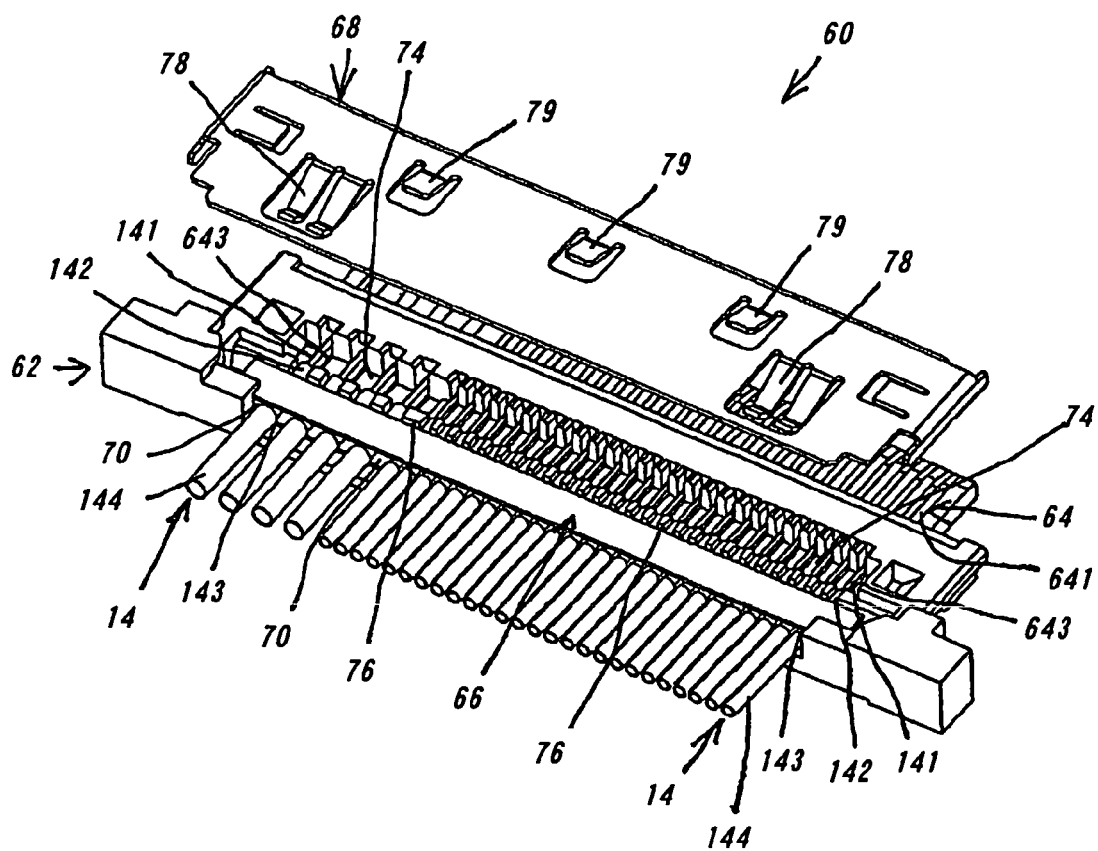
FIG. 9 is a perspective view of the plug connector of the prior art with the plug shell removed.

As another contact means for the receptacle shell 48, an elastic piece 57 may be used which extends into the fitting opening 52 and has an elasticity. The elastic piece 57 may be formed by forming slits 58 on both sides of the piece 57. Moreover, the elastic piece 57 may be curved convex as the anchoring pieces 78 and contact pieces 79 of the prior art plug connector 60 shown in FIGS. 8 and 9 illustrating the prior art. Only one elastic piece 57 may be enough to be sure to contact the ground bar 16 of the plug connector 10, but the number may be suitably determined in consideration of stability of contact, contact pressure and balancing when being fitted. The extending distance of the elastic piece 57 may be suitably designed in consideration of the fitting of the plug and receptacle connectors 10 and 40, contact pressure between the receptacle shell 48 and the ground bar 16, and strength and fitting (fitting power) of the elastic piece 57. As a result, the elastic piece 57 preferably extends of the order of 0.18 mm. The shape of the elastic piece 57 may be arbitrary insofar as the receptacle shell 48 and the ground bar 16 can contact each other. One example of the shape is curved convex.

A further contact means is a combination of the protrusion 56 and the elastic piece 57 as shown in FIG. 6B. In suitably designing the contact means in consideration of the fitting of the plug and receptacle connectors 10 and 40, contact pressure between the receptacle shell 48 and the ground bar 16, and strength and fitting (fitting power) of the elastic piece 57 as in the above case, the contact means have been found preferable to extend of the order of 0.18 mm and such a combination is employed in the embodiment. First, the receptacle shell 48 is formed substantially at the middle with two slits 58 to form an elastic piece 57 and then the elastic piece 57 is provided at both ends with two protrusions 56. In the illustrated embodiment, the elastic piece 57 extends 0.1 mm and the protrusions 56 extend 0.08 mm. The size of the elastic piece 57 may be suitably designed in consideration of the stability of contact, contact pressure, balancing when being fitted and fitting (fitting power). In the illustrated embodiment, the elastic piece is of 3 mm length.

Examples of application of the invention are plug connectors for use with mobile phone or cellular telephone, note book personal computer, digital camera and the like. Particularly, the invention achieves the low geometry in height of the plug connector and hence the receptacle connector, which is very beneficial for these appliances.

Figure 10:
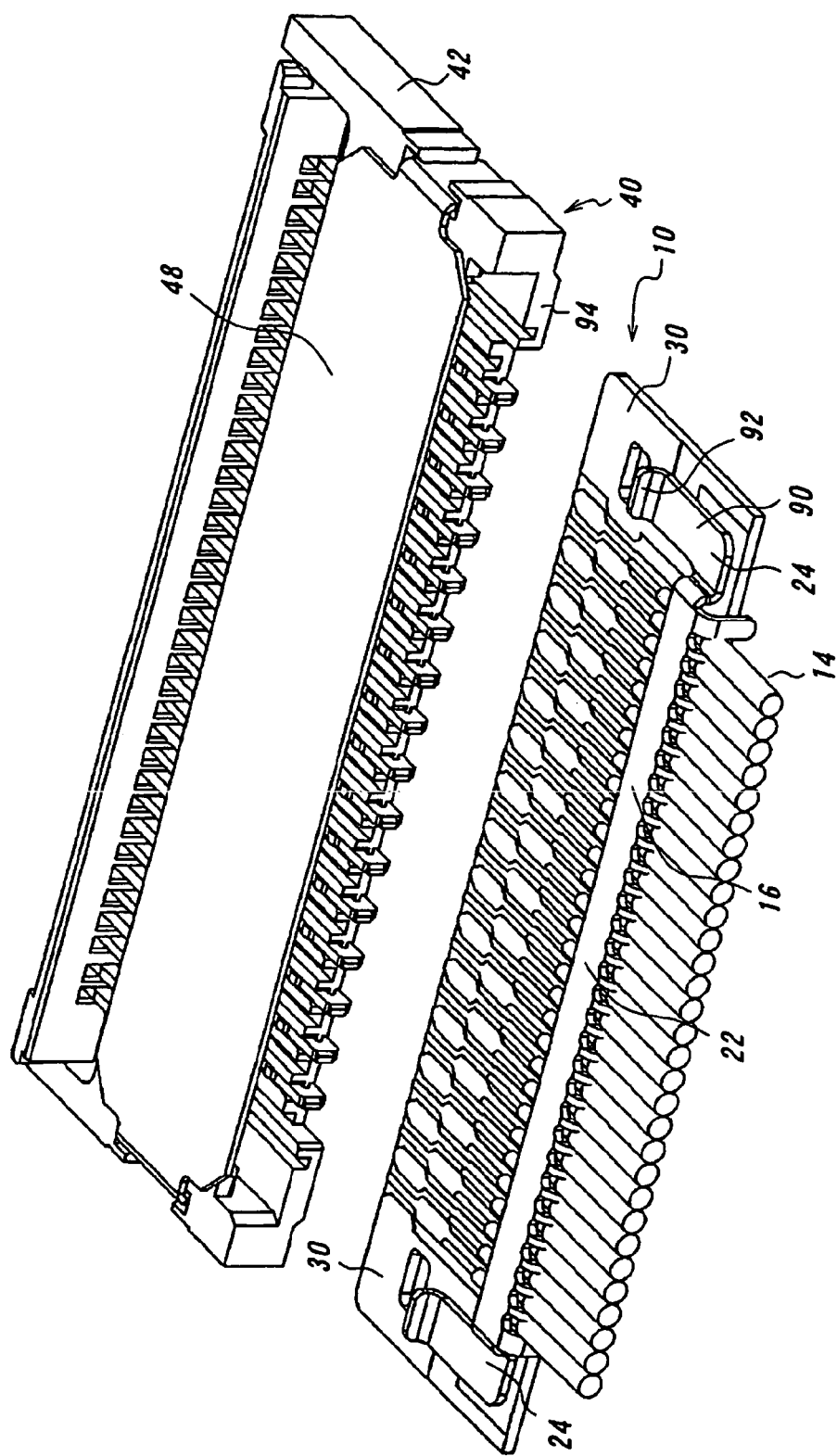
FIG. 10 is a perspective view illustrating the plug and receptacle connectors having erroneous insertion preventing means according to the invention immediately before the correct insertion.
Figure 11:
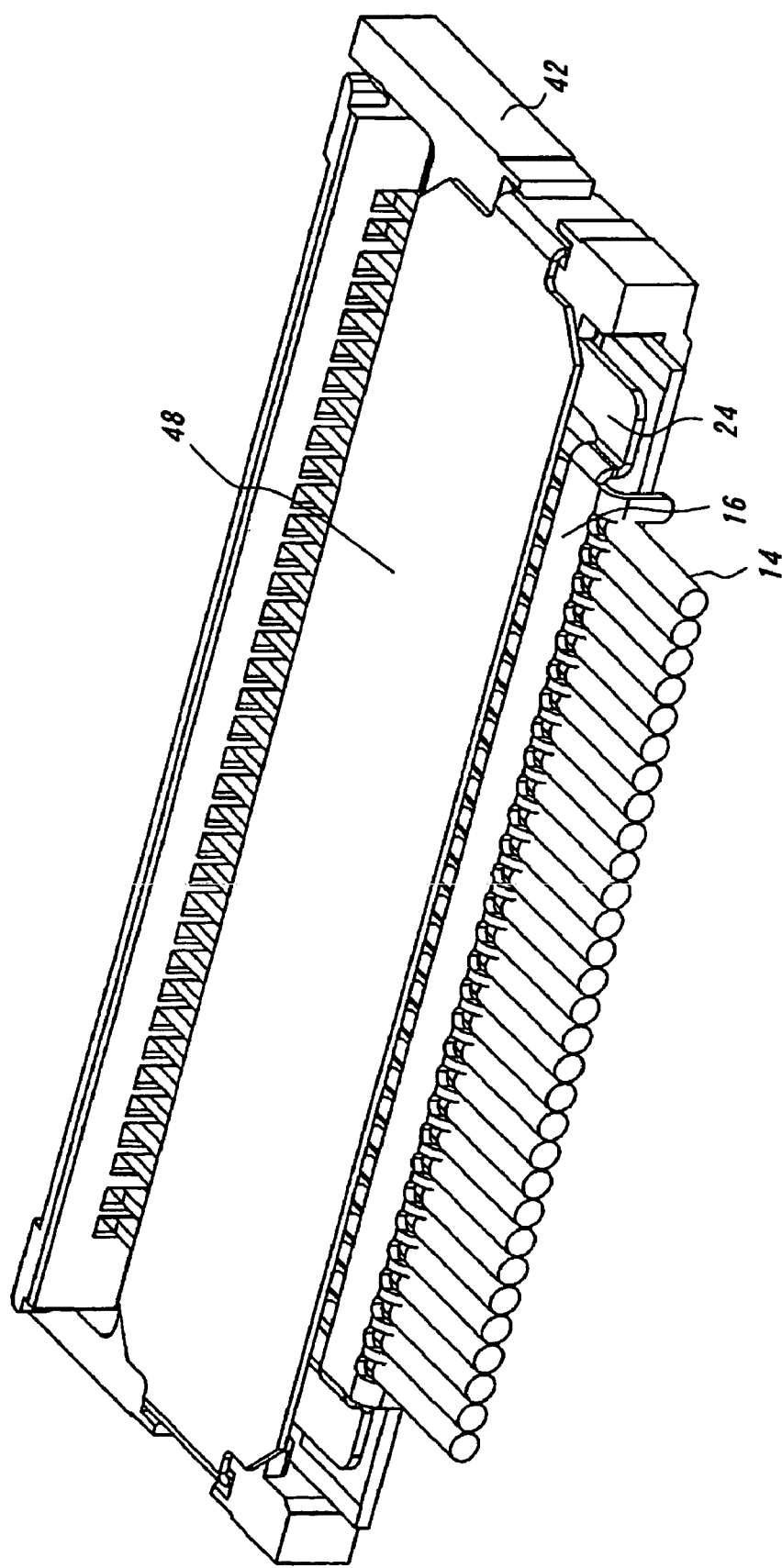
FIG. 11 is a perspective view illustrating the plug and receptacle connectors correctly fitted with each other.
Figure 12:
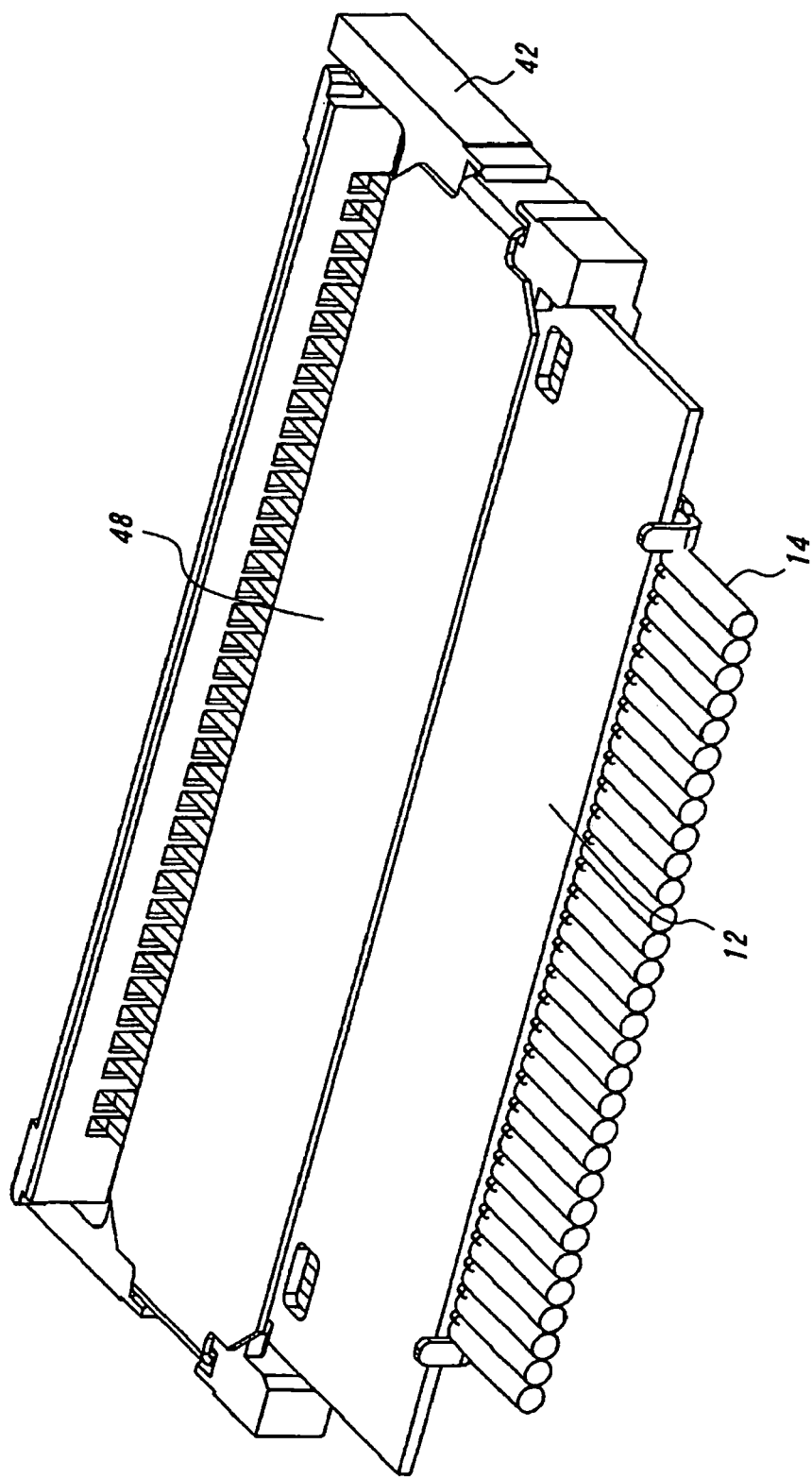
FIG. 12 is a perspective view of the erroneously inserted plug connector into the receptacle connector being prevented its further insertion from the shown position by means of the erroneous insertion preventing means according to the invention.

The connector of one preferred embodiment of the invention comprises erroneous insertion preventing means for preventing the plug connector turned upside down from its correct position from being inserted into the receptacle connector. FIGS. 10 and 11 illustrate the plug and receptacle connectors immediately before and after being fitted with each other in their correct positions, respectively. FIG. 12 illustrates the erroneously inserted plug connector into the receptacle connector being prevented from further insertion by means of the erroneous insertion preventing means and FIG. 13 shows the preventing means viewed from opposite side of the connectors.

Figure 13:
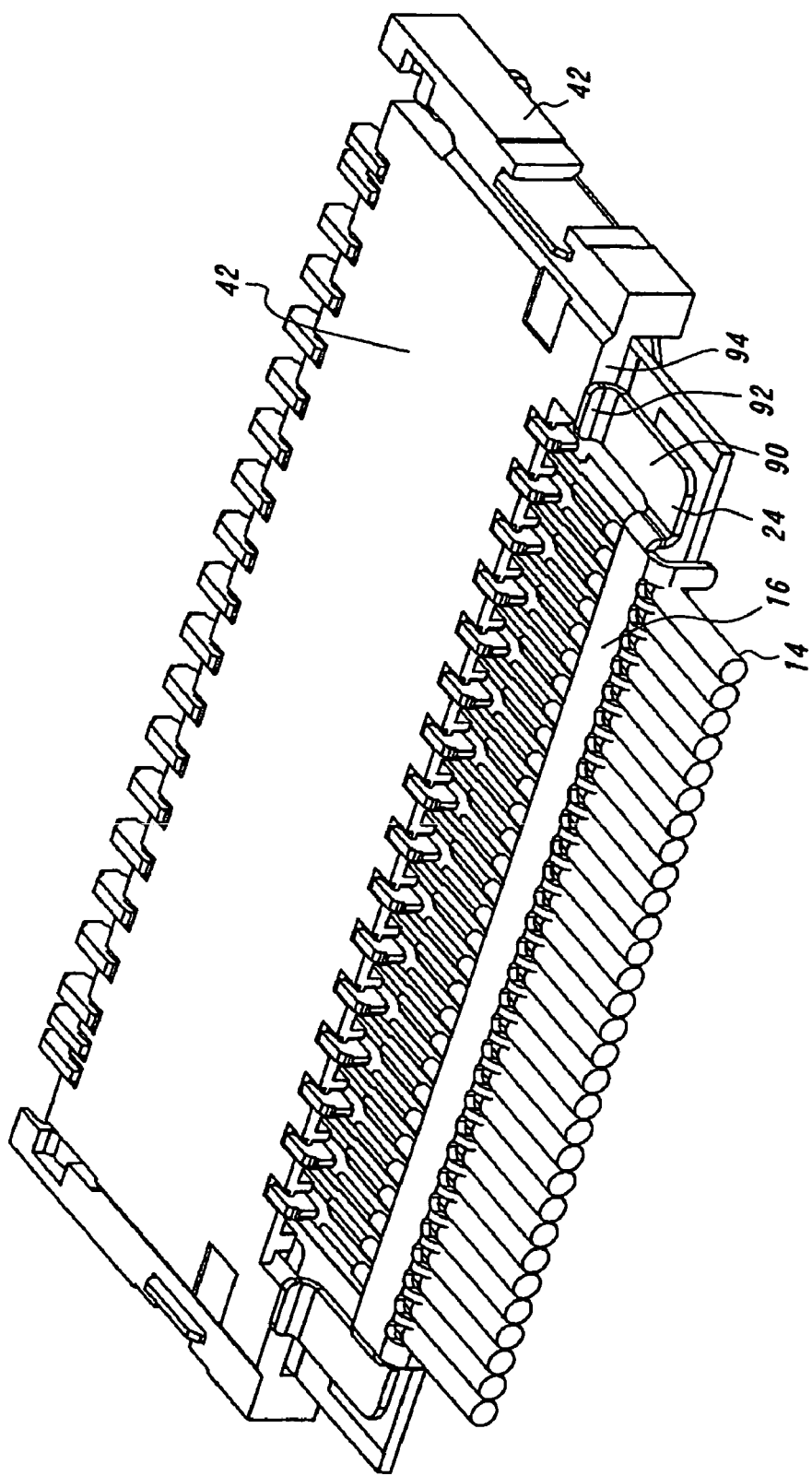
FIG. 13 is a perspective view of the plug and receptacle connectors shown in FIG. 12 viewed from the opposite side to illustrate the protrusions of the ground bar and the flat portions of the housing of the receptacle connector, which form the erroneous insertion preventing means according to the invention.

As shown in FIGS. 10 and 13, the ground bar 16 of the plug connector 10 is provided with protrusions 92 at both the ends. In the illustrated embodiment, the fixed portions 24 of the ground bar 16 are somewhat extended in the insertion direction of the plug connector 10 to form extension portions 90, each of which is further provided with the protrusion 92 substantially perpendicular to the extension portion 90. If the plug connector 10 erroneously turned upside down and is being inserted into the receptacle connector 40, the protrusions 92 abut against flat portion 94 of the housing 42 of the receptacle connector 40 so that further insertion of the plug connector is prevented. In this state, the flexible printed circuit board is not in contact with contact portions of the contacts of the receptacle connector so that no damage to contacts and circuit board occurs. When an operator finds out the erroneous insertion by the abutment of the protrusions 92 of the ground bar 16 against the housing 42, the plug connector can be easily pulled out or retracted from the receptacle connector, and the plug connector in correct position can be inserted into and connected with the receptacle connector without any failed connection. The projections 92 and the flat portions 94 may be formed in any shape and size so long as they achieve the above functions as erroneous insertion preventing means.

The invention claimed is:

1. An electrical connector including a plug connector and a receptacle connector detachably fitted with each other, said plug connector comprising a plurality of coaxial cables each having a center conductor, an insulator covering said center conductor, a braid as an external conductor covering said insulator, and a sheath covering said braid; a flexible printed circuit board having lands each connected to said center conductors of the coaxial cable and land portions to which a ground bar is connected; and said ground bar having a main portion adapted to contact said braids and fixed portions each positioned contiguously with said main portion and connected to said land portions wherein said ground bar of the plug connector is provided with projection pieces which extend from the main portion of the ground bar and are adapted to contact the braids at locations between said center conductors of all the coaxial cables or at locations between said center conductors of every other coaxial cable, and wherein said ground bar is provided with protrusion pieces contiguously with said main portion of the ground bar at predetermined positions on the surface to contact the coaxial cables so that said protrusion pieces are adapted to pierce into the coaxial cables, thereby causing the protrusion pieces to contact the center conductors and the braids of the coaxial cables.

2. The electrical connector as set forth in claim 1 wherein said receptacle connector comprises a housing, contacts, locking lever, and a receptacle shell covering said housing except for its portion associated with said locking lever, and said receptacle shell is provided on the side of a fitting opening with at least one contacting means adapted to contact the upper surface of said ground bar of the plug connector.

3. The electrical connector as set forth in claim 1 wherein said ground bar of the plug connector is provided with projection pieces which extend from the main portion of the ground bar and are adapted to contact the braids at intervals of plural locations between said coaxial cables.

4. The electrical connector as set forth in claim 1 wherein said projection pieces are in the form of a substantially L-shape.

5. The electrical connector as set forth in claim 4 wherein said projection pieces in the form of the substantially L-shape located at intervals of plural locations extend beyond the braids and are fixed to said flexible printed circuit board by soldering.

6. The electrical connector as set forth in claim 2 wherein the contacts at both the ends of said receptacle connector are each connected to said land portions.

7. The electrical connector as set forth in claim 2 wherein each of said contacts of said receptacle connector comprises a contact portion, a connection portion, an elastic portion and a fulcrum portion provided between said contact portion and said connection portion, a pressure receiving portion positioned opposed to said connection portion and extending from said elastic portion, and an extension portion having a further contact portion on the opposite side of the first mentioned contact portion, and the first mentioned contact portion, said elastic portion, said fulcrum portion and said connection portion being arranged in the form of a crank, and wherein said locking lever of said receptacle connector is provided with urging portions successively in its longitudinal direction, and said locking lever is installed in said housing so that said urging portions are each pivotally movable in the space between the connection portion and the pressure receiving portion of said contact.

8. The electrical connector as set forth in claim 7 wherein said receptacle connector is provided with locking members in the same construction as that of said contacts, and said flexible printed circuit board is provided with anchoring portions at positions corresponding to engaging portions of said locking members.

9. The electrical connector as set forth in claim 2 wherein as said contact means of the receptacle shell there is provided a protrusion extending into said fitting opening or an elastic piece having an elasticity extending into said fitting hole.

10. The electric connector as set forth in claim 8 wherein the plug connector and the receptacle connector are provided with a necessary number of locking members in accordance with a required suspension force of the connectors.

11. The electrical connector as set forth in claim 1 wherein said protrusion pieces of the ground bar are so arranged that they pierce every other or every third coaxial cable.

12. The electrical connector as set forth in claim 1 wherein said ground bar of the plug connector is provided at said fixed portions with protrusion portions adapted to abut against flat portions of a housing of said receptacle connector when one of the plug and receptacle connectors being turned upside down relative to the other is being fitted with each other, thereby preventing erroneous insertion of the plug connector into the receptacle connector.

13. The electrical connector as set forth in claim 12 wherein said protrusion portions are in the form of a substantially L-shape.

14. The electrical connector as set forth in claim 2 wherein said ground bar of the plug connector is provided with projection pieces which extend from the main portion of the ground bar and is adapted to contact the braids at locations between said center conductors of all the coaxial cables or at locations between said center conductors of every other coaxial cable.

15. The electrical connector as set forth in claim 2 wherein said ground bar of the plug connector is provided with projection pieces which extend from the main portion of the ground bar and is adapted to contact the braids at intervals of plural locations between said coaxial cables.

16. The electrical connector as set forth in claim 3 wherein said projection pieces are in the form of a substantially L-shape.

17. The electrical connector as set forth in claim 14 wherein said projection pieces are in the form of a substantially L-shape.

18. The electrical connector as set forth in claim 15 wherein said projection pieces are in the form of a substantially L-shape.

19. The electrical connector as set forth in claim 16 wherein said projection pieces in the form of the substantially L-shape located at intervals of plural locations extend beyond the braids and are fixed to said flexible printed circuit board by soldering.

20. The electrical connector as set forth in claim 17 wherein said projection pieces in the form of the substantially L-shape located at intervals of plural locations extend beyond the braids and are fixed to said flexible printed circuit board by soldering.

21. The electrical connector as set forth in claim 18 wherein said projection pieces in the form of the substantially L-shape located at intervals of plural locations extend beyond the braids and are fixed to said flexible printed circuit board by soldering.

22. The electrical connector as set forth in claim 3 wherein said ground bar is provided with protrusion pieces contiguously with said main portion of the ground bar at predetermined positions on the surface to contact the coaxial cables so that said protrusion pieces are each adapted to pierce into the coaxial cable, thereby causing each the protrusion piece to contact the center conductor and the braid of the coaxial cable.

23. The electrical connector as set forth in claim 14 wherein said ground bar is provided with protrusion pieces contiguously with said main portion of the ground bar at predetermined positions on the surface to contact the coaxial cables so that said protrusion pieces are each adapted to pierce into the coaxial cable, thereby causing each the protrusion piece to contact the center conductor and the braid of the coaxial cable.

24. The electrical connector as set forth in claim 15 wherein said ground bar is provided with protrusion pieces contiguously with said main portion of the ground bar at predetermined positions on the surface to contact the coaxial cables so that said protrusion pieces are each adapted to pierce into the coaxial cable, thereby causing each the protrusion piece to contact the center conductor and the braid of the coaxial cable.

25. The electrical connector as set forth in claim 22 wherein said protrusion pieces of the ground bar are so arranged that they pierce every other or every third coaxial cable.

26. The electrical connector as set forth in claim 23 wherein said protrusion pieces of the ground bar are so arranged that they pierce every other or every third coaxial cable.

27. The electrical connector as set forth in claim 24 wherein said protrusion pieces of the ground bar are so arranged that they pierce every other or every third coaxial cable.

* * * * *